US012295196B2

(12) United States Patent
Wakabayashi et al.

(10) Patent No.: US 12,295,196 B2
(45) Date of Patent: May 6, 2025

(54) IMAGING DEVICE

(71) Applicant: Panasonic Intellectual Property Management Co., Ltd., Osaka (JP)

(72) Inventors: Daisuke Wakabayashi, Osaka (JP); Yuuko Tomekawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 341 days.

(21) Appl. No.: 18/051,866

(22) Filed: Nov. 1, 2022

(65) Prior Publication Data
US 2023/0114451 A1   Apr. 13, 2023

Related U.S. Application Data

(63) Continuation of application No. PCT/JP2021/016256, filed on Apr. 22, 2021.

(30) Foreign Application Priority Data

May 22, 2020 (JP) ................. 2020-089650

(51) Int. Cl.
*H10K 39/32* (2023.01)
*H01L 27/146* (2006.01)
*H10K 39/38* (2023.01)

(52) U.S. Cl.
CPC ....... *H10K 39/32* (2023.02); *H01L 27/14665* (2013.01); *H10K 39/38* (2023.02)

(58) Field of Classification Search
CPC .. H10K 39/32; H10K 39/38; H01L 27/14665; H01L 27/14667; H01L 27/14669;

(Continued)

(56) References Cited

U.S. PATENT DOCUMENTS

2006/0044561 A1\* 3/2006 Nii ..................... H10K 85/6572
356/218
2009/0134485 A1\* 5/2009 Lee ................... H01L 27/14667
257/E31.124

(Continued)

FOREIGN PATENT DOCUMENTS

| JP | 2014-027300 | 2/2014 |
| JP | 2014-067768 | 4/2014 |
| JP | 2019-016667 | 1/2019 |

OTHER PUBLICATIONS

International Search Report of PCT application No. PCT/JP2021/016256 dated Jul. 6, 2021.

*Primary Examiner* — Zandra V Smith
*Assistant Examiner* — Molly K Reida
(74) *Attorney, Agent, or Firm* — Rimon P.C.

(57) ABSTRACT

An imaging device includes: a photoelectric conversion film; a first electrode located above the photoelectric conversion film; a second electrode; a plug coupled to the second electrode; a protective film located above the second electrode; and a wiring line that electrically couples the first electrode to the second electrode. The protective film overlaps the entire plug and does not overlap the photoelectric conversion film in plan view. The second electrode includes a non-overlapping portion that does not overlap the protective film in plan view, and the wiring line is coupled to the non-overlapping portion of the second electrode.

13 Claims, 17 Drawing Sheets

(58) Field of Classification Search
CPC .......... H01L 27/1467; H01L 27/14672; H01L 27/14674; H01L 27/14676
See application file for complete search history.

(56) References Cited

U.S. PATENT DOCUMENTS

| | | | |
|---|---|---|---|
| 2014/0131828 A1* | 5/2014 | Isono | H01L 27/14636 257/459 |
| 2019/0214427 A1* | 7/2019 | Nozawa | H01L 27/14643 |
| 2020/0119099 A1 | 4/2020 | Shibuta | |

* cited by examiner

IMAGING DEVICE

BACKGROUND

1. Technical Field

The present disclosure relates to an imaging device.

2. Description of the Related Art

An image sensor includes pixels that are one-dimensionally or two-dimensionally arranged. Each of the pixels includes a photodetection element that generates an electric signal corresponding to an amount of incident light. Among such image sensors, a multilayer image sensor corresponds to an image sensor including pixels each provided with a photodetection element having a structure in which a photoelectric conversion film is laminated on a substrate. Examples of the multilayer image sensor are disclosed in Japanese Patent No. 5946132 and Japanese Unexamined Patent Application Publications No. 2014-27300 and No. 2019-16667.

SUMMARY

In one general aspect, the techniques disclosed here feature an imaging device including: a photoelectric conversion film; a first electrode located above the photoelectric conversion film; a second electrode; a plug coupled to the second electrode; a protective film located above the second electrode; and a wiring line that electrically couples the first electrode to the second electrode. The protective film overlaps an entirety of the plug and does not overlap the photoelectric conversion film in plan view. The second electrode includes a non-overlapping portion that does not overlap the protective film in plan view, and the wiring line is coupled to the non-overlapping portion of the second electrode.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
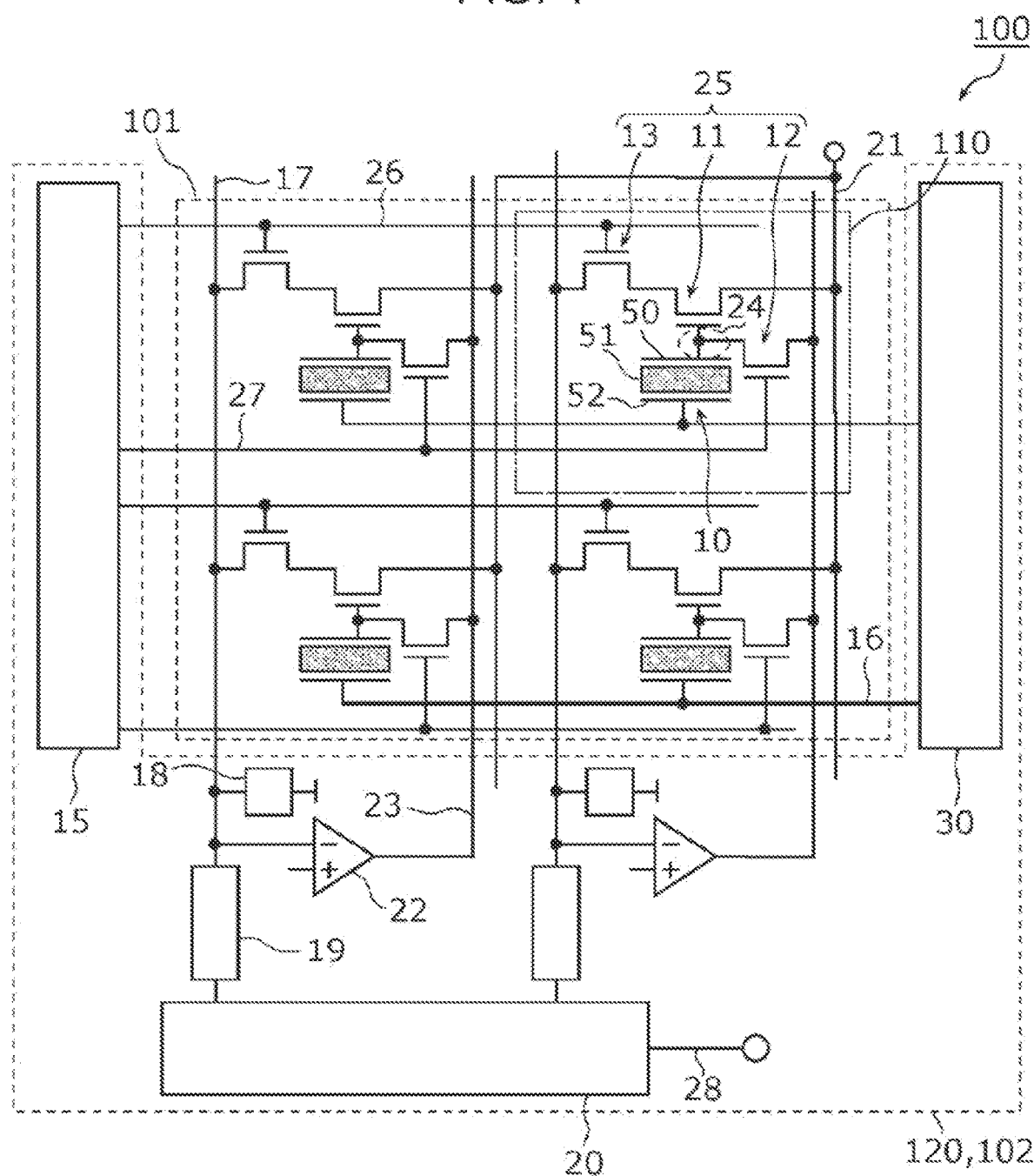
FIG. 1 is a circuit diagram illustrating a circuit configuration of an imaging device according to an embodiment.

In a multi layer image sensor, a transparent electrode may be formed on a photoelectric conversion film and a plug for feeding electric power to the transparent electrode may also be provided. When this plug comes into contact with a substance such as moisture or oxygen, the plug may be modified, thus leading to deterioration in characteristics of the imaging device.

The present disclosure provides an imaging device that suppresses deterioration in characteristics.

Underlying Knowledge Forming Basis of Present Disclosure

The inventors have found out that the imaging devices of the related art may cause the following problems.

In the structure disclosed in Japanese Patent No. 5946132, for example, the plug may be modified by oxygen or moisture as a consequence of conducting an etching process using a plasma as typified by patterning of the photoelectric conversion layer, exposure to the atmosphere for a long time, and the like.

An imaging device according to one aspect of the present disclosure includes: a photoelectric conversion film; a first electrode located above the photoelectric conversion film; a second electrode; a plug coupled to the second electrode; a protective film located above the second electrode; and a wiring line that electrically couples the first electrode to the second electrode. The protective film overlaps an entirety of the plug and does not overlap the photoelectric conversion film in plan view. The second electrode includes a non-overlapping portion that does not overlap the protective film in plan view, and the wiring line is coupled to the non-overlapping portion of the second electrode.

Accordingly, the protective film can protect the plug against the substance such as moisture or oxygen, which is apt to deteriorate the characteristics of the imaging device. Since the plug is kept from modification by coming into contact with the substance such as moisture or oxygen, it is possible to suppress increases in resistance value of the plug, contact resistance between the plug and a second electrode, and so forth. The protective film can be formed immediately after forming the plug and the second electrode. Hence, the plug can also be protected adequately against the substance such as moisture or oxygen during a manufacturing process of the imaging device. As described above, according to the aspect of the present disclosure, it is possible to provide the imaging device that suppresses deterioration in characteristics.

For example, the protective film may include a marginal portion that extends outward from the plug in plan view. A tip end in an extending direction of the marginal portion may be located away by 1 μm or more from the plug in plan view.

It is thus possible to provide a long distance between an end portion of the protective film and the plug, whereby the substance such as moisture or oxygen is less likely to reach the plug while bypassing the protective film. As a consequence, it is possible to suppress modification of the plug due to the contact with the substance such as moisture or oxygen, and thus to provide the imaging device that suppresses deterioration in characteristics.

The marginal portion may surround the entire circumference of the plug in plan view, for example. The marginal portion may be annularly provided across the entire circumference of the plug.

It is thus possible to more strongly keep the substance such as moisture or oxygen from reaching the plug while bypassing the protective film.

According to the example disclosed in Japanese Unexamined Patent Application Publication No. 2019-16667, an electrode to cover a plug is covered with an interlayer insulating film. The interlayer insulating film extends long from a surface of the electrode to a region on an outer side. This configuration therefore poses a significant constraint on a layout design of the imaging device.

An area of the protective film may be smaller than an area of the second electrode in plan view, for example.

It is thus possible to form the protective film smaller than the second electrode, thereby increasing the freedom of layout design of the imaging device. It is possible to increase the area of a portion of the second electrode not covered with the protective film, thereby favorably securing electric connection between the wiring line and the second electrode.

A film thickness of the protective film may be larger than or equal to 0.5 μm, for example.

It is thus possible to suppress passage of the substance such as oxygen and hydrogen through the protective film. Since the substance such as oxygen and hydrogen can be kept from passing through the protective film and reaching the plug, it is possible to provide the imaging device that suppresses deterioration in characteristics.

The plug may contain copper, for example.

It is thus possible to suppress modification of copper (Cu), and to secure sufficient conductivity of the plug.

In the example disclosed in Japanese Unexamined Patent Application Publication No. 2014-27300, an etching-resistant layer is provided on a superficial layer of an electrode that covers a plug. However, the etching-resistant layer needs to be made of a material that can establish electrical coupling to metallic wiring lines or wires. Accordingly, this technique has a problem that the material of the etching-resistant layer is limited to a metal.

For example, in the imaging device according to one aspect of the present disclosure, the protective film may be provided with an insulating property.

Thus, a material having a low transmission rate of moisture or oxygen as typified by aluminum oxide can be used as the protective film. Thus, it is possible to enhance the freedom of selection of the material that can be used as the protective film.

The wiring line may cover the protective film, for example.

It is thus possible to form the protective film before formation of the wiring line. Accordingly, the protective film can protect the plug against an etching gas used for patterning the photoelectric conversion film and the first electrode or against the air and the like. In other words, the plug is kept from coming into contact with the substance such as moisture or oxygen during the manufacturing process of the imaging device. Since the modification of the plug due to the contact with the substance such as moisture or oxygen is suppressed, it is possible to provide the imaging device that suppresses deterioration in characteristics.

The first electrode may be provided with translucency, for example. A width of the protective film may be smaller than a width of the second electrode, for example. The protective film does not have to overlap the first electrode in plan view, for example. The second electrode may be in contact with a side surface of the photoelectric conversion film, for example. For example, a side surface of the first electrode may be flush with the side surface of the photoelectric conversion film.

Embodiments will be specifically described below with reference to the drawings.

Noted that the embodiments described below are intended to represent comprehensive or specific examples. Numerical values, shapes, materials, constituents, layout positions and coupling modes of the constituents, manufacturing steps, the order of the manufacturing steps, and the like described in the following embodiments are mere examples and not intended to limit the scope of the present disclosure. Among the constituents discussed in the following embodiments, those not defined in the independent claim will be explained as optional constituents.

The respective drawings are schematic drawings which are not necessarily illustrated with precision. Accordingly, reduction scales and other factors are not always consistent throughout the drawings, for example. Substantially the same constituents in the respective drawings are denoted by the same reference signs and duplicate explanations will be omitted or simplified as appropriate.

Terms that represent relations between the elements such as "parallel" and "coinciding", terms that represent shapes of the elements such as "rectangular" and "circular", and numerical ranges in the specification are not the expressions in the strict sense, but are the expressions that encompass substantially equivalent ranges that cover differences in several percent, for example.

In this specification, the terms "above" and "below" do not always represent an upward direction (vertically upward) and a downward direction (vertically downward) in light of absolute space recognition, but are used as the terms to be defined by relative positional relations based on the order of lamination in a laminated structure. The terms "above" and "below" are applied not only to a situation where two constituents are disposed with a space in between while providing a different constituent between the aforementioned two constituents, but also to a situation where two constituents are located in close contact with each other in such a way that the two constituents adhere to each other.

Embodiment

Circuit Configuration of Imaging Device

A circuit configuration of an imaging device according to an embodiment will generally be described with reference to FIG. 1.

FIG. 1 is a schematic diagram illustrating a circuit configuration of an imaging device 100 according to this embodiment. As illustrated in FIG. 1, the imaging device 100 includes pixels 110 and a peripheral circuit 120.

The pixels 110 form a pixel region 101 by being arranged two-dimensionally, that is, in a row direction and a column direction on a semiconductor substrate. The pixel 110 may be arranged in a line instead. In other words, the imaging device 100 may also be a line image sensor. In this specification, the row direction and the column direction mean directions of extension of rows and columns, respectively. To be more precise, the column direction is a perpendicular direction while the row direction is a horizontal direction.

Each pixel 110 includes a photodetector 10 and a charge detection circuit 25. The photodetector 10 includes a pixel electrode 50, a photoelectric conversion film 51, and a transparent electrode 52. A specific structure of the photodetector 10 will be described later. The charge detection circuit 25 includes an amplifying transistor 11, a reset transistor 12, and an address transistor 13.

The imaging device 100 includes a voltage control element for applying a predetermined voltage to the transparent electrode 52. The voltage control element includes a voltage control circuit, a voltage generation circuit such as a constant voltage source, and a voltage reference line such as a ground line, for example. The voltage applied from the voltage control element is referred to as a control voltage. In this embodiment, the imaging device 100 includes a voltage control circuit 30 as the voltage control element.

The voltage control circuit 30 may generate a constant control voltage or generate several control voltages having different values. For example, the voltage control circuit 30 may generate two or more control voltages having different values, or generate such a control voltage that varies continuously within a predetermined range. The voltage control circuit 30 determines the value of the control voltage to be generated based on an instruction from an operator who operates the imaging device 100 or on an instruction from another controller and the like provided to the imaging device 100, and generates the control voltage having the determined value. The voltage control circuit 30 is provided in a peripheral region 102 located outside of a photosensitive region as part of the peripheral circuit 120. Note that the photosensitive region is substantially the same as the pixel region 101.

In this embodiment, the voltage control circuit 30 applies the control voltage to the transparent electrodes 52 of the pixels 110 arranged in the row direction through counter electrode signal lines 16 as illustrated in FIG. 1. Thus, the voltage control circuit 30 changes the voltage between each pixel electrode 50 and the transparent electrode 52, thereby switching a spectral sensitivity characteristic of each photodetector 10.

The pixel electrode 50 is set to a higher electric potential than that of the transparent electrode 52 in order to accumulate electrons in the pixel electrode 50 as signal charges out of electrons and holes generated by the photoelectric conversion film as a consequence of irradiation of the photodetector 10 with light. In this case, a traveling direction of the electrons is a reverse direction to a traveling direction of the holes. Accordingly, an electric current flows from the pixel electrode 50 to the transparent electrode 52. The pixel electrode 50 is set to a lower electric potential than that of the transparent electrode 52 in order to accumulate the holes in the pixel electrode 50 as the signal charges out of the electrons and the holes generated by the photoelectric conversion film as a consequence of irradiation of the photodetector 10 with light. In this case, the electric current flows from transparent electrode 52 to the pixel electrode 50.

The pixel electrode 50 is coupled to a gate electrode of the amplifying transistor 11. The signal charges collected by the pixel electrode 50 are accumulated in a charge accumulation node 24 located between the pixel electrode 50 and the gate electrode of the amplifying transistor 11. In this embodiment, the signal charges are the holes. Instead, the signal charges may be the electrons.

The signal charges accumulated in the charge accumulation node 24 are applied to the gate electrode of the amplifying transistor 11 as a voltage corresponding to an amount of the signal charges. The amplifying transistor 11 is included in the charge detection circuit 25, and amplifies the voltage applied to the gate electrode. The address transistor 13 selectively reads out the amplified voltage as a signal voltage. The address transistor 13 is also referred to as a row-select transistor. One of a source electrode and a drain electrode of the reset transistor 12 is coupled to the pixel electrode 50 so as to reset the signal charges accumulated in the charge accumulation node 24. In other words, the reset transistor 12 resets the electric potentials at the gate electrode of the amplifying transistor 11 and at the pixel electrode 50.

In order to selectively conduct the above-described operation on the pixels 110, the imaging device 100 includes a power supply wiring line 21, perpendicular signal lines 17, address signal lines 26, and reset signal lines 27. These wiring line and signal lines are coupled to the pixels 110, respectively. To be more precise, the power supply wiring line 21 is coupled to one of a source electrode and a drain electrode of each amplifying transistor 11. Each perpendicular signal line 17 is coupled to another one of a source electrode and a drain electrode of the address transistor 13, that is, the one that is not coupled to the amplifying transistor 11. Each address signal line 26 is coupled to a gate electrode of the address transistor 13. Each reset signal line 27 is coupled to a gate electrode of the reset transistor 12.

The peripheral circuit 120 includes a perpendicular scanning circuit 15, a horizontal signal readout circuit 20, column signal processing circuits 19, load circuits 18, difference amplifiers 22, and the voltage control circuit 30. The perpendicular scanning circuit 15 is also referred to as a row scanning circuit. The horizontal signal readout circuit 20 is also referred to as a column scanning circuit. Each column signal processing circuit 19 is also referred to as a row signal accumulation circuit. Each difference amplifier 22 is also referred to as a feedback amplifier.

The perpendicular scanning circuit 15 is coupled to the address signal line 26 and the reset signal line 27. The perpendicular scanning circuit 15 selects the pixels 110 arranged on the respective rows on the row basis, then reads out the signal voltages and resets the electric potentials of the pixel electrodes 50. The power supply wiring line 21 supplies a predetermined power supply voltage to each pixel 110. The horizontal signal readout circuit 20 is electrically coupled to the column signal processing circuits 19. Each column signal processing circuit 19 is electrically coupled to the pixels 110 arranged on each column through the perpendicular signal line 17 corresponding to each column. The load circuits 18 are electrically coupled to the respective perpendicular signal lines 17. Each load circuit 18 and the corresponding amplifying transistor 11 collectively constitute a source follower circuit.

The difference amplifiers 22 are provided so as to correspond to the respective columns. An input terminal on a negative side of each difference amplifier 22 is coupled to the corresponding perpendicular signal line 17. An output terminal of the difference amplifier 22 is coupled to the pixel 110 through a feedback line 23 corresponding to each column.

The perpendicular scanning circuit 15 applies a row select signal for controlling on and off of each address transistor 13 to the gate electrode of the address transistor 13 through the address signal line 26. Thus, the row targeted for readout is scanned and selected. The signal voltages are read out of the pixels 110 on the selected row to the perpendicular signal line 17. The perpendicular scanning circuit 15 applies a reset signal for controlling on and off of each reset transistor 12 to the gate electrode of the reset transistor 12 through the reset signal line 27. Thus, the row of the pixels 110 targeted for a resetting operation is selected. The perpendicular signal line 17 transmits the signal voltages read out of the pixels 110 selected by the perpendicular scanning circuit 15 to the column signal processing circuit 19.

The column signal processing circuit 19 carries out noise suppression signal processing as typified by correlated double sampling, analog to digital conversion (AD conversion), and so forth. To be more precise, the column signal processing circuit 19 includes a sample and hold circuit. The sample and hold circuit includes a capacitor, a transistor, and the like. The sample and hold circuit samples the signal voltage read out through the perpendicular signal line 17, and temporarily retains the voltage. The horizontal signal readout circuit 20 reads out a digital value corresponding to a value of the retained voltage.

The horizontal signal readout circuit 20 sequentially reads the signals from the column signal processing circuits 19 to a horizontal common signal line 28.

Each difference amplifier 22 is coupled to the other one of the drain electrode and the source electrode of the reset transistor 12, which is not coupled to the pixel electrode 50, through the feedback line 23. Accordingly, an input terminal on a negative side of the difference amplifier 22 receives an outputted value from the address transistor 13 when the address transistor 13 and the reset transistor 12 are in a state of conduction. The difference amplifier 22 carries out a feedback operation in such a way that a gate potential of the amplifying transistor 11 is set equal to a predetermined feedback voltage. In this instance, a value of an output voltage from the difference amplifier 22 is set either to 0 V or to a positive voltage near 0 V. The feedback voltage means the output voltage from the difference amplifier 22.

Structure of Pixel

Figure 2:
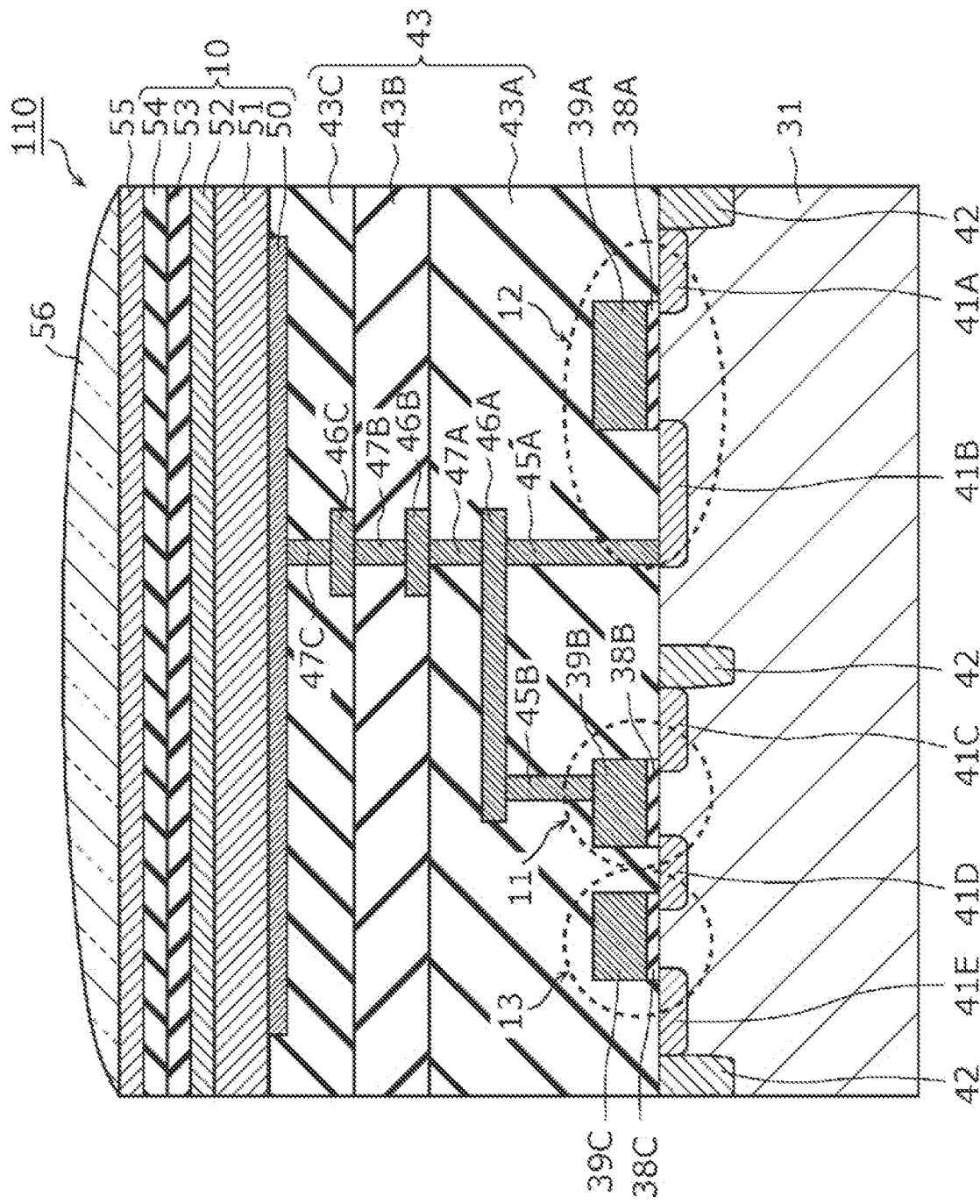
FIG. 2 is a schematic sectional view of a pixel in the imaging device according to the embodiment.

A detailed device structure of each pixel 110 in the imaging device 100 will be described below with reference to FIG. 2. FIG. 2 is a schematic sectional view of the pixel 110 in the imaging device 100 according to this embodiment.

As illustrated in FIG. 2, the pixel 110 includes a semiconductor substrate 31, the charge detection circuit 25 (not shown in FIG. 2), and the photodetector 10. The semiconductor substrate 31 is a p-type silicon substrate, for example. The charge detection circuit 25 detects the signal charges captured by the pixel electrode 50, and outputs the signal voltage. The charge detection circuit 25 includes the amplifying transistor 11, the reset transistor 12, and the address transistor 13, which are formed at the semiconductor substrate 31.

Each of the amplifying transistor 11, the reset transistor 12, and the address transistor 13 represents an example of an electric element formed at the semiconductor substrate 31. Each of the amplifying transistor 11, the reset transistor 12, and the address transistor 13 is a metal oxide semiconductor field effect transistor (MOSFET), for example. To be more precise, each of the amplifying transistor 11, the reset transistor 12, and the address transistor 13 is an n-channel MOSFET, but may be a p-channel MOSFET instead.

The amplifying transistor 11 includes n-type impurity regions 41C and 41D, a gate insulating layer 38B, and a gate electrode 39B. The n-type impurity regions 41C and 41D are formed in the semiconductor substrate 31, and function as a drain and a source, respectively. The gate insulating layer 38B is located on the semiconductor substrate 31. The gate electrode 39B is located on the gate insulating layer 38B.

The reset transistor 12 includes n-type impurity regions 41A and 41B, a gate insulating layer 38A, and a gate electrode 39A. The n-type impurity regions 41A and 41B are formed in the semiconductor substrate 31, and function as a drain and a source, respectively. The gate insulating layer 38A is located on the semiconductor substrate 31. The gate electrode 39A is located on the gate insulating layer 38A.

The address transistor 13 includes the n-type impurity region 41D, an n-type impurity region 41E, a gate insulating layer 38C, and a gate electrode 39C. The n-type impurity regions 41D and 41E are formed in the semiconductor substrate 31, and function as a drain and a source, respectively. The gate insulating layer 38C is located on the semiconductor substrate 31. The gate electrode 39C is located on the gate insulating layer 38C.

The gate insulating layers 38A, 38B, and 38C are formed by using an insulating material. For example, each of the gate insulating layers 38A, 38B, and 38C has a single layer structure of a silicon oxide film or a silicon nitride film, or a laminated structure of these materials.

The gate electrodes 39A, 39B, and 39C are each formed by using a conductive material. For example, the gate electrodes 39A, 39B, and 39C are formed by using polysilicon, which is provided with conductivity by adding an impurity thereto. Alternatively, the gate electrodes 39A, 39B, and 39C may be formed by using a metallic material such as copper.

The n-type impurity regions 41A, 41B, 41C, 41D, and 41E are formed by doping the semiconductor substrate 31 with an n-type impurity such as phosphorus (P) by means of ion implantation and the like. In the example illustrated in FIG. 2, the n-type impurity region 41D is shared by the amplifying transistor 11 and the address transistor 13. In this way, the amplifying transistor 11 and the address transistor 13 are coupled in series. The n-type impurity region 41D may be separated into two n-type impurity regions instead. These two n-type impurity regions may be electrically coupled to each other by using a wiring layer.

In the semiconductor substrate 31, element isolation regions 42 are provided between the adjacent pixels 110 as well as between the amplifying transistor 11 and the reset transistor 12. The adjacent pixels 110 are electrically separated from each other by using the element isolation region 42. A leakage of the signal charges accumulated in the charge accumulation node 24 is suppressed by providing the element isolation region 42. The element isolation regions 42 are formed by doping the semiconductor substrate 31 with a p-type impurity at a high concentration, for example.

A multilayered wiring structure is provided at an upper surface of the semiconductor substrate 31. The multilayered wiring structure includes interlayer insulating layers, one or more wiring layers, one or more conductive plugs, and one or more contact plugs. Specifically, an interlayer insulating layer 43 is laminated on the upper surface of the semiconductor substrate 31.

Contact plugs 45A and 45B, wiring lines 46A, 46B, and 46C, and plugs 47A, 47B, and 47C are buried in the interlayer insulating layer 43. Note that the interlayer insulating layer 43 is formed by laminating insulating layers 43A, 43B, and 43C in this order. An upper surface of the interlayer insulating layer 43 is flat and parallel to the upper surface of the semiconductor substrate 31, for example.

The contact plug 45A is coupled to the n-type impurity region 41B of the reset transistor 12. The contact plug 45B is coupled to the gate electrode 39B of the amplifying transistor 11. The wiring line 46A couples the contact plug 45A to the contact plug 45B. Thus, the n-type impurity region 41B of the reset transistor 12 is electrically coupled to the gate electrode 39B of the amplifying transistor 11.

The wiring line 46A is coupled to the pixel electrode 50 through the plugs 47A, 47B, and 47C as well as the wiring lines 46B and 46C. Thus, the n-type impurity region 41B, the gate electrode 39B, the contact plugs 45A and 45B, the wiring lines 46A, 46B, and 46C, the plugs 47A, 47B, and 47C, and the pixel electrode 50 collectively constitute the charge accumulation node 24.

The photodetector 10 is provided on the interlayer insulating layer 43. The photodetector 10 includes the transparent electrode 52, the photoelectric conversion film 51, and the pixel electrode 50 located closer to the semiconductor substrate 31 than is the transparent electrode 52.

The photoelectric conversion film 51 subjects the light incident on the transparent electrode 52 side to photoelectric conversion, thereby generating the signal charges corresponding to the intensity of the incident light. The photoelectric conversion film 51 is made of an organic semiconductor, for example. The photoelectric conversion film 51 may include one or more organic semiconductor layers. For example, in addition to a photoelectric conversion layer that generates pairs of holes and electrons, the photoelectric conversion film 51 may also include a carrier transport layer that transports the electrons or the holes, a blocking layer that blocks the carriers, and the like. These organic semiconductor layers may adopt an organic p-type semiconductor and an organic n-type semiconductor, which are publicly known materials. The photoelectric conversion film 51 may be any one of a mixed film of organic donor molecules and acceptor molecules, a mixed film of semiconductor-type carbon nanotubes and acceptor molecules, and a quantum dot-containing film, for example. The photoelectric conversion film 51 may be formed by using an inorganic material such as amorphous silicon.

The photoelectric conversion film 51 is sandwiched between the transparent electrode 52 and the pixel electrode 50. In this embodiment, the photoelectric conversion film 51 is continuously formed across the pixels 110. To be more precise, the photoelectric conversion film 51 is formed into a shape of a single flat plate in such a way as to cover the entire pixel region 101 in plan view.

The transparent electrode 52 is an example of a first electrode located above the photoelectric conversion film 51. The transparent electrode 52 is formed by using such a material that is transparent relative to the light to be detected and has electric conductivity at the same time. For example, the transparent electrode 52 is formed by using a transparent conductive semiconductor oxide film such as indium tin oxide (ITO), aluminum-added zinc oxide (AZO), and gallium-added zinc oxide (GZO). The transparent electrode 52 may be formed by using other transparent conductive semiconductors or may be formed by using a metallic thin film which is thin enough for transmitting the light.

As with the photoelectric conversion film 51, the transparent electrode 52 is continuously formed across the pixels 110. To be more precise, the transparent electrode 52 is formed into a shape of a single flat plate in such a way as to cover the majority of the pixel region 101 in plan view. The transparent electrode 52 continuously covers the entire upper surface of the photoelectric conversion film 51.

The pixel electrode 50 is opposed to the transparent electrode 52 while interposing the photoelectric conversion film 51 in between. The pixel electrode 50 is provided for each of the pixels 110. The pixel electrode 50 is formed by using a metal such as aluminum and copper or by using a conductive material such as polysilicon doped with an impurity and thud provided with conductivity.

The photodetector 10 includes an insulating layer 53 formed at least at part of an upper surface of the transparent electrode 52. The photodetector 10 further includes a passivation film 54. The insulating layer 53 covers at least part of the upper surface of the transparent electrode 52. The passivation film 54 is provided above the insulating layer 53.

Each of the insulating layer 53 and the passivation film 54 is formed by using an insulating material. For example, the insulating layer 53 is formed from any of silicon oxide, silicon nitride, silicon oxynitride, organic or inorganic polymer materials, and the like. The insulating layer 53 and the passivation film 54 are transparent relative to the light with the wavelength to be detected by the imaging device 100, for example.

As illustrated in FIG. 2, each pixel 110 includes a color filter 55 located above the transparent electrode 52 of the photodetector 10. The pixel 110 includes a microlens 56 located on the color filter 55. The pixel 110 does not always have to include the insulating layer 53, the passivation film 54, the color filter 55, or the microlens 56.

Structure of Peripheral Region

A structure of the peripheral region 102 of the imaging device 100 will be described below with reference to FIGS. 3 to 7. Specifically, a structure in the vicinity of an end portion of the photoelectric conversion film 51 will be described.

Figure 3:
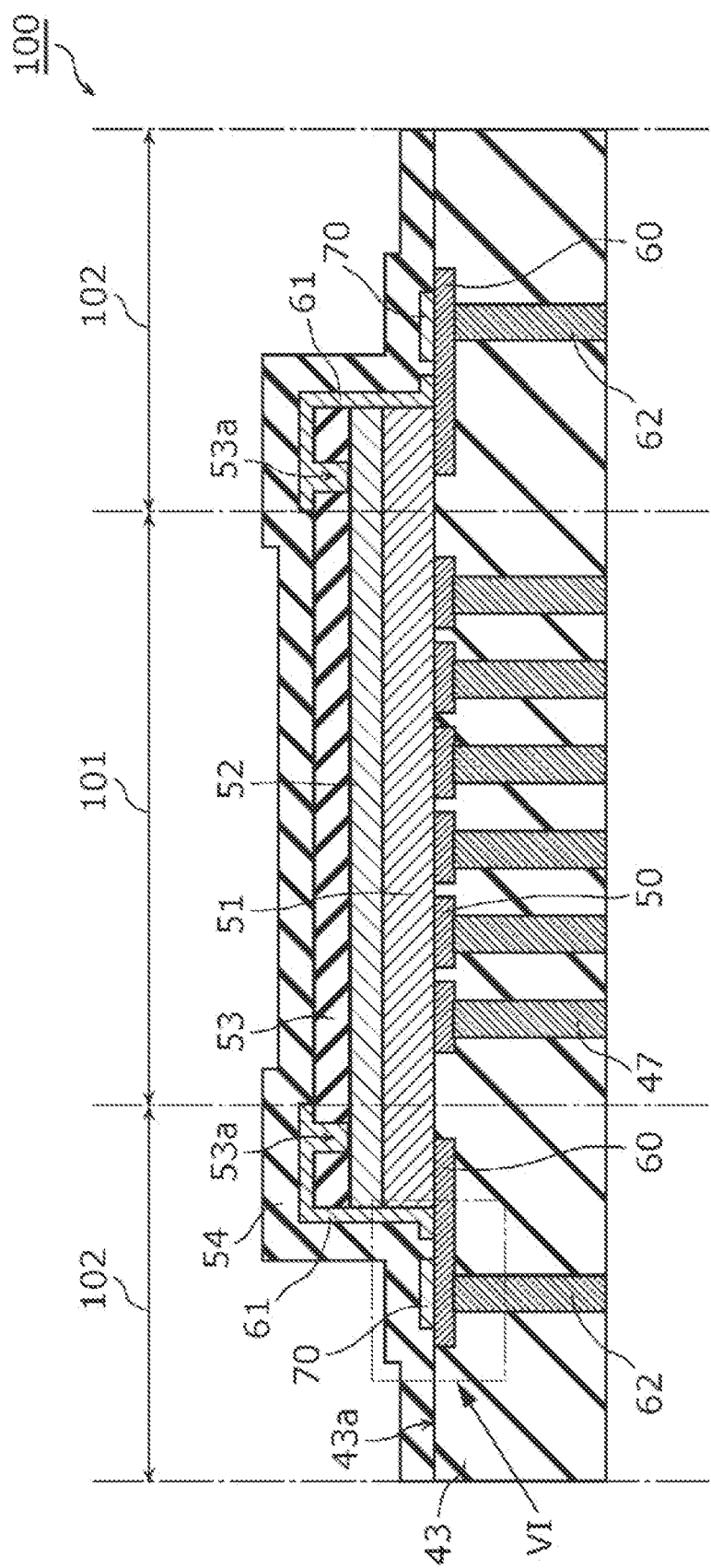
FIG. 3 is a schematic sectional view of the imaging device according to the embodiment.

FIG. 3 is a schematic sectional view of the imaging device 100 according to this embodiment. Note that the plugs 47A, 47B, and 47C illustrated in FIG. 2 are collectively indicated as a plug 47 in FIG. 3. Illustration of the semiconductor substrate 31, the various transistors, the wiring line, and the like is omitted in FIG. 3. The same applies to FIGS. 9 to 15 and to FIG. 17 to be discussed later.

Figure 4:
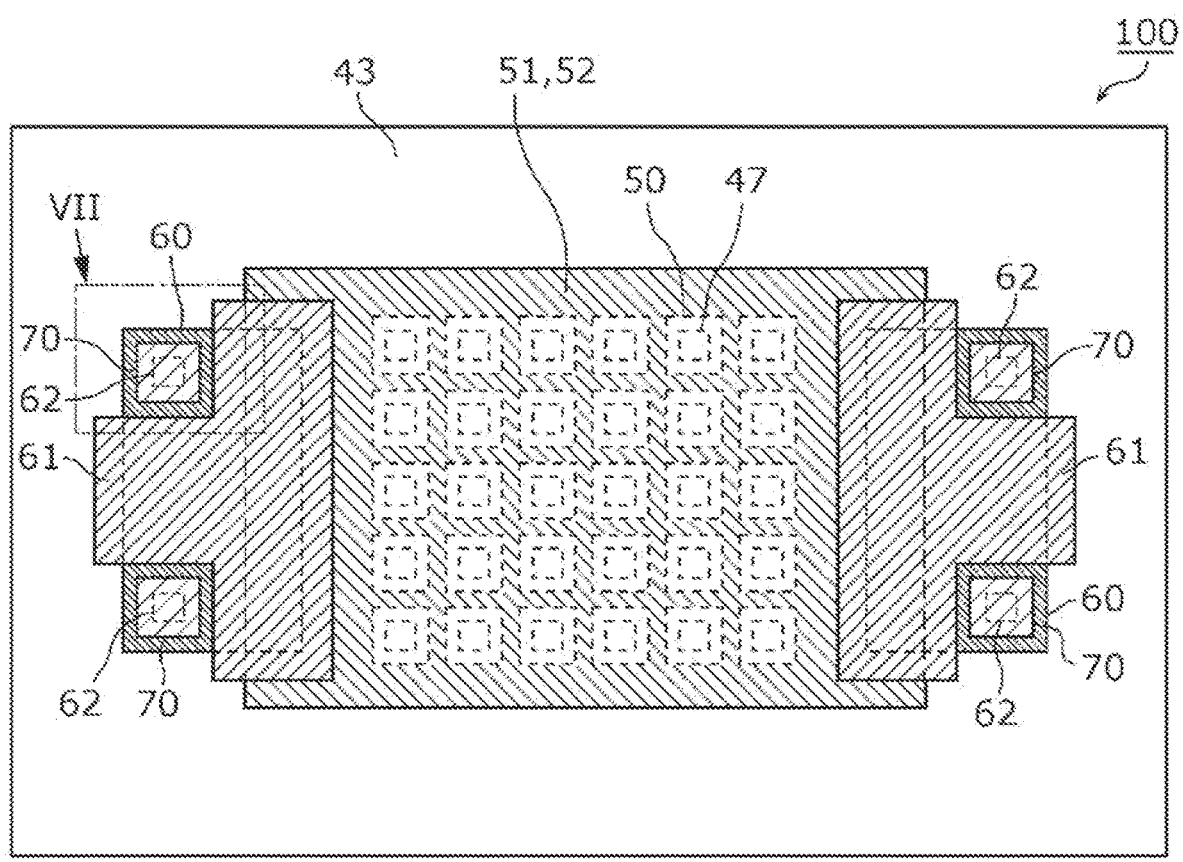
FIG. 4 is a schematic plan view of the imaging device according to the embodiment.

FIG. 4 is a schematic plan view of the imaging device 100 according to this embodiment. Note that respective constituents such as the photoelectric conversion film 51 in FIG. 4 are provided with hatched lines in order to facilitate recognition of shapes thereof. There are also portions in the photoelectric conversion film 51 and the transparent electrode 52 not provided with the supposed hatched lines in order to facilitate recognition of shapes of the pixel electrodes 50 and the plugs 47.

As illustrated in FIG. 3, the imaging device 100 includes the pixel region 101 and the peripheral region 102. The pixel region 101 is a region provided with the pixels 110. Although the pixels 110 are not clearly indicated in FIG. 3, a range that overlaps each pixel electrode 50 in plan view corresponds to each pixel 110.

The peripheral region 102 is a region located on the periphery of the pixel region 101, which is the region including the peripheral circuit 120. The peripheral region 102 is a region in a shape of a frame that surrounds the pixel region 101 in plan view. The peripheral region 102 may be regions split into two pieces and provided along two sides of the pixel region 101 opposed to each other. Alternatively, the peripheral region 102 may be a region of any of a rectangular shape, an L-shape, and a U-shape extending along one or more sides of the rectangular pixel region 101.

As illustrated in FIG. 3, the photoelectric conversion film 51, the transparent electrode 52, and the insulating layer 53 are provided to the entire pixel region 101. The passivation film 54 is provided not only to the pixel region 101 but also to the entire peripheral region 102. The photoelectric conversion films 51 may be provided separately to the respective pixels 110. The transparent electrode 52 may be integrally coupled to each row or column of the pixels 110 that are arranged two-dimensionally.

In this embodiment, a portion of a boundary between the pixel region 101 and the peripheral region 102 is defined by using a contour of a wiring line 61. To be more precise, of the contour of the wiring line 61, a portion on the center side of the imaging device 100 defines the boundary between the pixel region 101 and the peripheral region 102 in plan view.

In this embodiment, the imaging device 100 includes two wiring lines 61 as illustrated in FIGS. 3 and 4. The two wiring lines 61 are provided along two sides of the imaging device 100 having a rectangular shape in plan view. A range interposed between the two wiring lines 61 in plan view is the pixel region 101. The pixel region 101 may be defined as a region surrounded by the contour of the photoelectric conversion film 51 in plan view. Alternatively, the pixel region 101 may be defined as a region which is provided with the pixel electrodes located on the outermost periphery of the two-dimensionally arranged pixel electrodes 50 and is located inside of the pixel electrodes on the outermost periphery.

Figure 5:
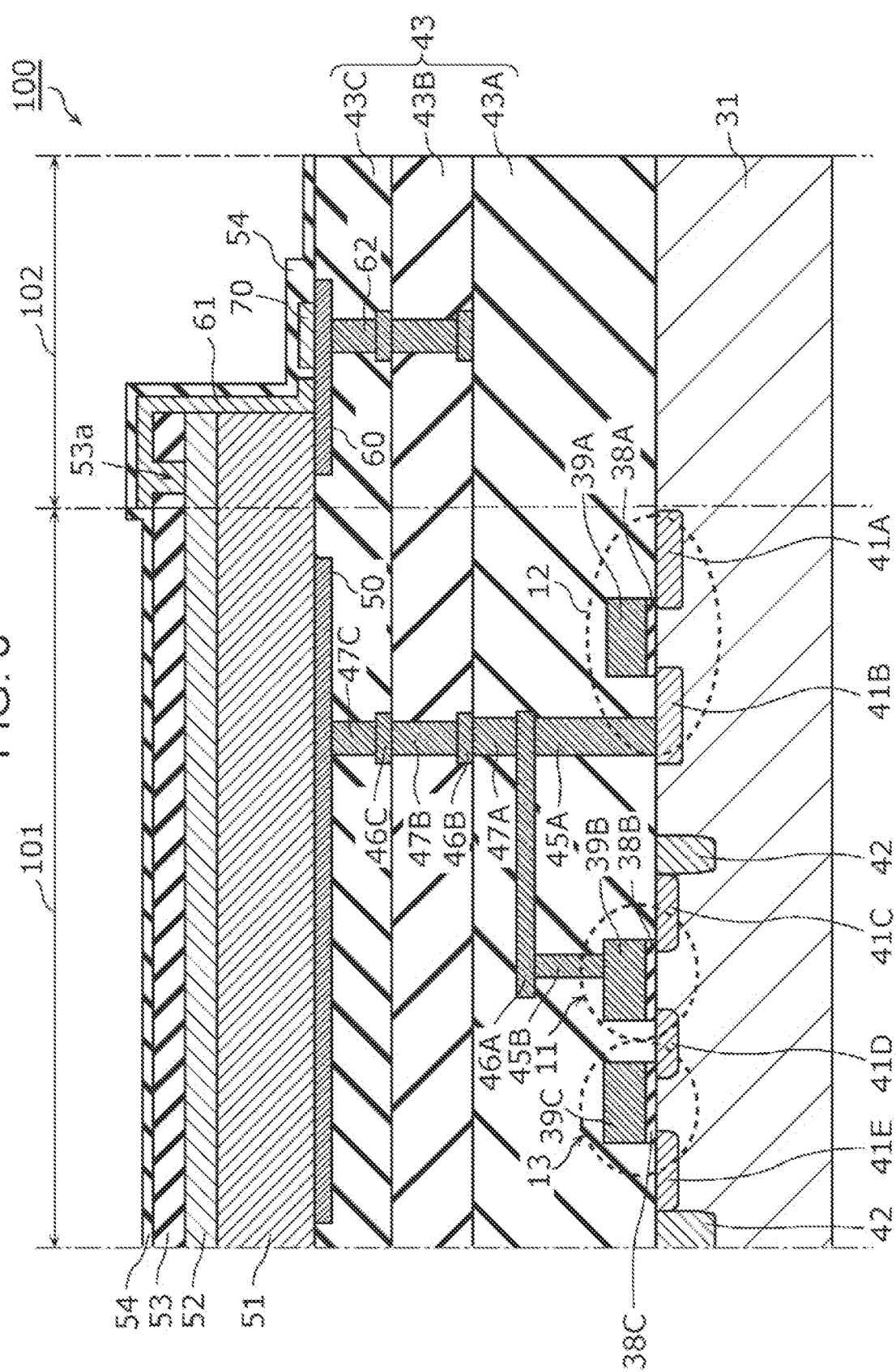
FIG. 5 is a schematic sectional view illustrating t vicinity of an end portion of the imaging device according to the embodiment.

FIG. 5 is a schematic sectional view illustrating the vicinity of the end portion of the imaging device 100 according to this embodiment. The pixel electrode 50 illustrated in FIG. 5 is the pixel electrode located on the outermost periphery. As illustrated in FIG. 5, the amplifying transistor 11, the reset transistor 12, and the address transistor 13, which are coupled to the pixel electrode 50 located on the outermost periphery, are situated in the pixel region 101 but not in the peripheral region 102. In other words, the amplifying transistor 11, the reset transistor 12, and the address transistor 13 do not overlap the wiring line 61 in plan view.

As illustrated in FIGS. 3 and 4, the imaging device 100 includes plug top electrodes 60, plugs 62, and protective films 70. Two plug top electrodes 60 are provided as with the wiring lines 61. Four plugs 62 and four protective films 70 are provided. Note that the numbers of these constituents are not limited to particular numbers. The plug top electrodes 60, the wiring lines 61, the plugs 62, and the protective films 70 are provided in the peripheral region 102.

Each plug top electrode 60 is an example of a second electrode having at least a portion not overlapping the transparent electrode 52 serving as the first electrode in plan view. As illustrated in FIG. 3, the plug top electrode 60 is provided in such a way as to extend outward from a lower portion of the photoelectric conversion film 51. In other words, the portion of the plug top electrode 60 is covered with the photoelectric conversion film 51. The plug top electrode 60 does not always have to be covered with the photoelectric conversion film 51 and may be provided away from the photoelectric conversion film 51 and the transparent electrode 52 in plan view.

The plug top electrode 60 is formed by using the same material as the pixel electrode 50, for example. Alternatively, the plug top electrode 60 may be formed by using a conductive material that is different from the material of the pixel electrode 50. For example, the plug top electrode 60 may contain a conductive metal nitride such as titanium nitride (TiN) and a tantalum nitride (TaN) as a main component.

The plug top electrode 60 is provided on the same layer as the pixel electrodes 50. To be more precise, a height of the plug top electrode 60 from the semiconductor substrate 31 is equal to respective heights of the pixel electrodes 50 from the semiconductor substrate 31. For example, illustrated in FIG. 3, an upper surface of the plug top electrode 60 and respective upper surfaces of the pixel electrodes 50 are flush with an upper surface 43a of the interlayer insulating layer 43.

Figure 6:
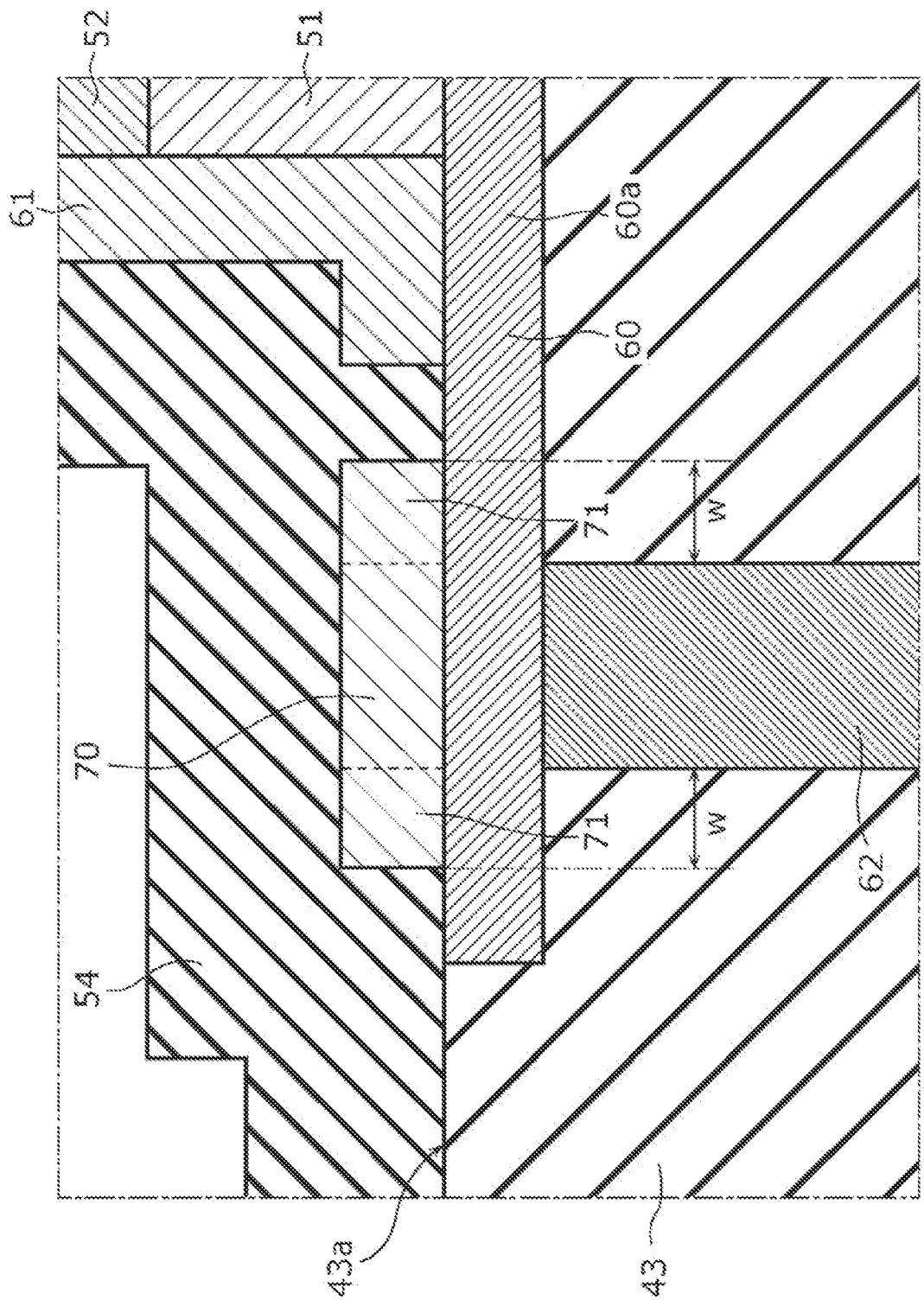
FIG. 6 is an enlarged schematic sectional view illustrating an enlarged region VI in FIG. 3.
Figure 7:
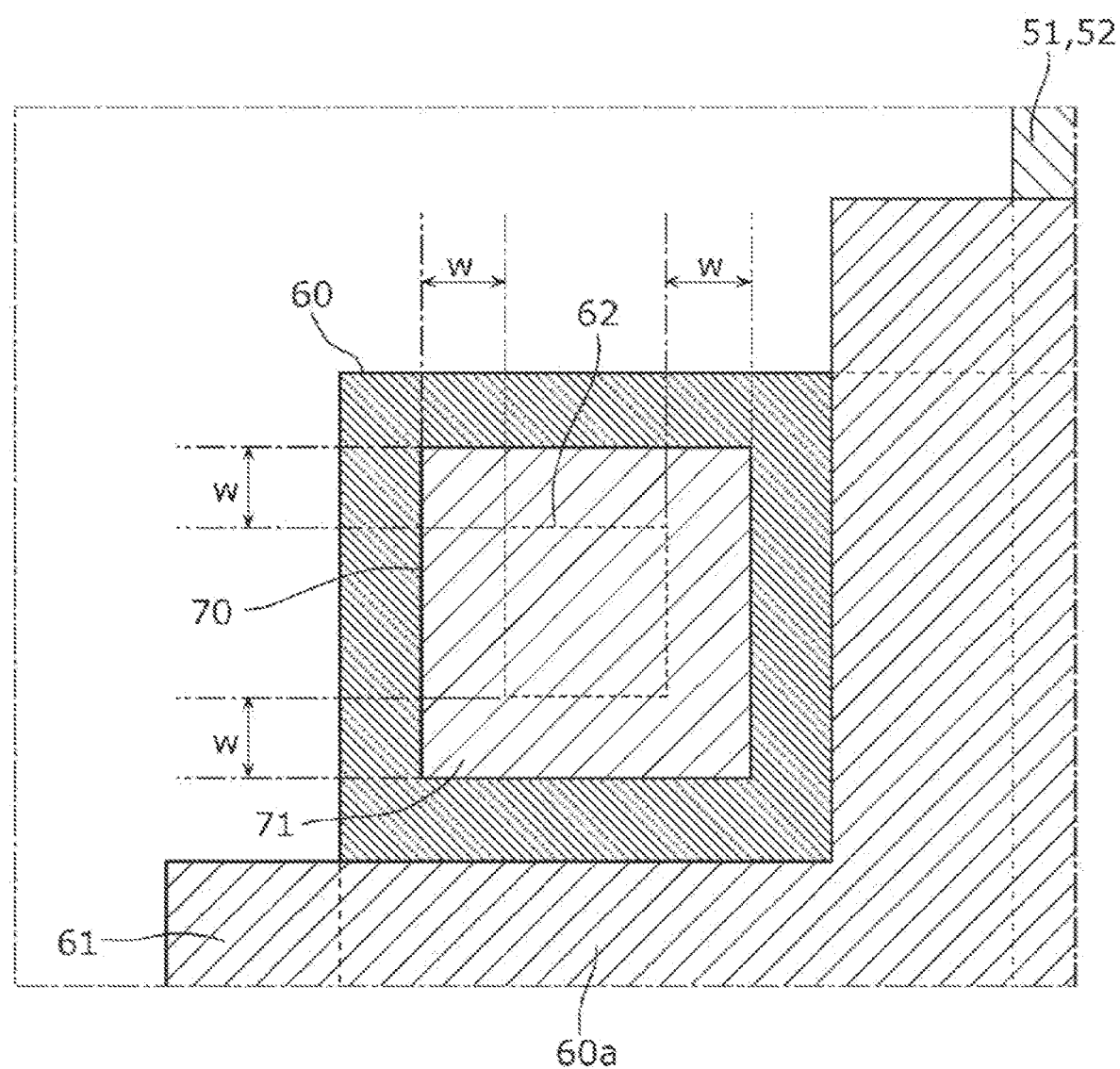
FIG. 7 is an enlarged schematic plan view illustrating an enlarged region VII in FIG. 4.

FIG. 6 is an enlarged schematic sectional view illustrating an enlarged region VI in FIG. 3. FIG. 7 is an enlarged schematic plan view illustrating an enlarged region VII in FIG. 4. As illustrated in FIGS. 6 and 7, the plug top electrode 60 includes a non-overlapping portion 60a that does not overlap the protective film 70 in plan view. The non-overlapping portion 60a is covered neither by the photoelectric conversion film 51 nor by the protective film 70, and its upper surface is exposed.

The wiring line 61 electrically couples the transparent electrode 52 to the plug top electrode 60. As illustrated in FIG. 3, the wiring line 61 is coupled to an end portion of the transparent electrode 52, thus coming into contact with and covering respective end surfaces of the insulating layer 53, the transparent electrode 52, and the photoelectric conversion film 51. The insulating layer 53 is provided with a through hole 53a that exposes the upper surface of the transparent electrode 52. The wiring line 61 is coupled to the upper surface of the transparent electrode 52 via the through hole 53a. In this way, a contact area of the wiring line 61 with transparent electrode 52 becomes larger than that in the case of contact only with the end surface of the transparent electrode 52. Thus, it is possible to reduce contact resistance.

The wiring line 61 is coupled to the non-overlapping portion 60a of the plug top electrode 60. In other words, the wiring line 61 comes into contact with the plug top electrode 60 at the portion not covered with the protective film 70, thus establishing electrical and physical coupling thereto.

The wiring line 61 is formed by using a conductive material such as a metal. The wiring line 61 may be provided with a tight-shielding property. The wiring line 61 is a metallic film made of any of titanium, aluminum, copper, tungsten, gold, silver, nickel, cobalt, aluminum with addition of silicon and copper (AlSiCu), and alloys thereof. Alternatively, the wiring line 61 may be a metal nitride film such as titanium nitride. The wiring line 61 may have a single layer structure of the metallic film or the metal nitride film, or may have a laminated structure thereof.

The plug 62 is coupled to the plug top electrode 60. The plug 62 is coupled to a lower surface of the plug top electrode 60. As illustrated in FIGS. 3 and 4, the plug 62 is provided at such a position that does not overlap the photoelectric conversion film 51 or the transparent electrode 52 in plan view. In this embodiment, the plug 62 does not overlap the wiring line 61 in plan view.

The plug 62 is formed by using a conductive material such as a metal. The plug 62 is formed by using a material different from the materials of the wiring line 61 and the plug top electrode 60. For example, the plug 62 contains copper (Cu) as a main component. The plug 62 is formed from elementary copper or an alloy that contains copper.

Plating is generally adopted as a method of forming each plug 62. Cu has universally been adopted as a material used for plating, and also has a good record from quality perspectives. The use of Cu enables production of the plug 62 at low costs. In this way, it is possible to achieve high quality and low costs of the plug 62 at the same time.

The protective film 70 is located above the plug top electrode 60 and overlaps the entire plug 62 in plan view. In other words, the protective film 70 completely covers the plug 62. In plan view, the plug 62 does not stick out of the protective film 70 or include a portion not covered with the protective film 70.

As illustrated in FIG. 6, the protective film 70 is provided in contact with the upper surface of the plug top electrode 60. The protective film 70 is provided away from the wiring line 61.

The protective film 70 is formed by using a material having a barrier performance against a substance (which may be hereinafter simply referred to as a "corrosion source" when appropriate) that reacts with the substance contained in the plug 62 and modifies the plug 62. Examples of the corrosion source include moisture, oxygen, or the like. To be more precise, the protective film 70 is formed by using a material having low moisture permeability and low oxygen permeability.

Since the protective film 70 covers the plug 62, the protective film 70 can protect the plug 62 against the corrosion source such as oxygen or moisture. For example, a contour of the protective film 70 may coincide with a contour of the plug 62 in plan view.

In this embodiment, the protective film 70 includes a marginal portion 71 as illustrated in FIGS. 6 and 7. A protection performance can be enhanced by providing a certain margin in accordance with a processing capacity when forming the protective film 70.

As illustrated in FIG. 7, the marginal portion 71 is a portion that extends outward from the plug 62 in plan view. Specifically, the marginal portion 71 is a portion of the protective film 70 which is does not overlap the plug 62 in plan view. The marginal portion 71 is annularly provided along the entire circumference of the plug 62 in plan view. In other words, the protective film 70 is designed to cover the plug 62 and formed slightly larger than the plug 62. By forming the protective film 70 slightly larger than the plug 62 in plan view, it is possible to protect the plug 62 more reliably against the corrosion source such as oxygen or moisture.

In plan view, a tip end in an extending direction of the marginal portion 71 is located away by 1 µm or more from the plug 62. In the case of a sectional view illustrated in FIG. 6, for example, a distance from the end portion of the protective film 70 to the plug 62 is larger than or equal to 1 µm. The distance corresponds to a width w of the marginal portion 71. In this embodiment, the width w of the marginal portion 71 is uniform in terms of a circumferential direction in plan view as illustrated in FIG. 7. The annular marginal portion 71 having the width w larger than or equal to 1 µm is provided across the entire circumference of the plug 62.

The width w of the marginal portion 71 may vary in part. For example, in the cross-section illustrated in FIG. 6, the width w of the marginal portion 71 is larger than or equal to 1 µm. In a cross-section different from that in FIG. 6, the width w of the marginal portion 71 may be smaller than 1 µm. A portion where the width w of the marginal portion 71 becomes equal to 0 may also be included. In other words, the marginal portion 71 may be provided only partially along the contour of the plug 62 in plan view.

For example, the marginal portion 71 may be split into two pieces and provided along two sides of the plug 62 opposed to each other, the plug 62 having a rectangular shape in plan view. Alternatively, the marginal portion 71 may be a region of any of a rectangular shape, an L-shape, and a U-shape extending along one or more sides of the rectangular plug 62. Since the protective film 70 only needs to cover the plug 62 completely, the shape of the protective film 70 in plan view may be a circular shape which is circumscribed about the plug 62, for example.

Although details will be described later, the protective film 70 is formed by depositing a film for the protective film 70 and then removing unnecessary portions of the film by etching. In this instance, positioning for etching is generally carried out by using a photolithographic technique. Positioning accuracy in the photolithographic technique can be achieved at a level of ±1 µm by using a mask aligner or a stepper to be generally used in the semiconductor process. Accordingly, setting the width w of the marginal portion 71 larger than or equal to 1 µm makes it possible to protect the plug 62 more reliably against the corrosion source such as oxygen or moisture even in case of the occurrence of a variation in processing accuracy.

As illustrated in FIG. 4, the protective films 70 may be provided one by one to the plugs 62. Alternatively, the protective film 70 may collectively cover the plugs 62. For example, the single protective film 70 may be provided in such a way as to cover two plugs 62 provided in such a way as to sandwich a single wiring line 61 as illustrated in FIG. 4.

In this embodiment, an area of the protective film 70 is smaller than an area of the plug top electrode 60. The entire protective film 70 is provided inside of the contour of the plug top electrode 60 in plan view. In other words, the protective film 70 is provided in such a way that the entire lower surface of the protective film 70 comes into contact with the upper surface of the plug top electrode 60. The protective film 70 is provided in such a way to be kept from sticking out of the plug top electrode 60.

In this way, a difference in level is less likely to be provided to the protective film 70, and film quality of the protective film 70 can thus be enhanced. Accordingly, it is possible to enhance the performance to protect the plug 62. It is possible to expose the upper surface of the plug top electrode 60 by forming the protective film 70 smaller than the plug top electrode 60. In other words, it is possible to provide the plug top electrode 60 with the non-overlapping portion 60a, thereby securing electrical coupling between the wiring line 61 and the plug top electrode 60.

In this embodiment, the protective film 70 is provided with an insulating property. To be more precise, the protective film 70 is any of a silicon oxide film, a silicon nitride film, a silicon oxynitride film, or the like. For example, the silicon nitride film has low permeability to oxygen molecules and the like as with the silicon oxide film, so that the silicon nitride film can fully function as the protective film 70.

The protective film 70 may be formed by using a conductive material. The material used for forming the protective film 70 is not limited to a particular material as long as the material has low permeability to the corrosion source.

A film thickness of the protective film 70 is set larger than or equal to 0.5 µm, for example. Now, a description will be given below as to why the thickness of the protective film 70 is set larger than or equal to 0.5 µm. The description will be given of the case where the protective film 70 is the silicon oxide film.

Figure 8:
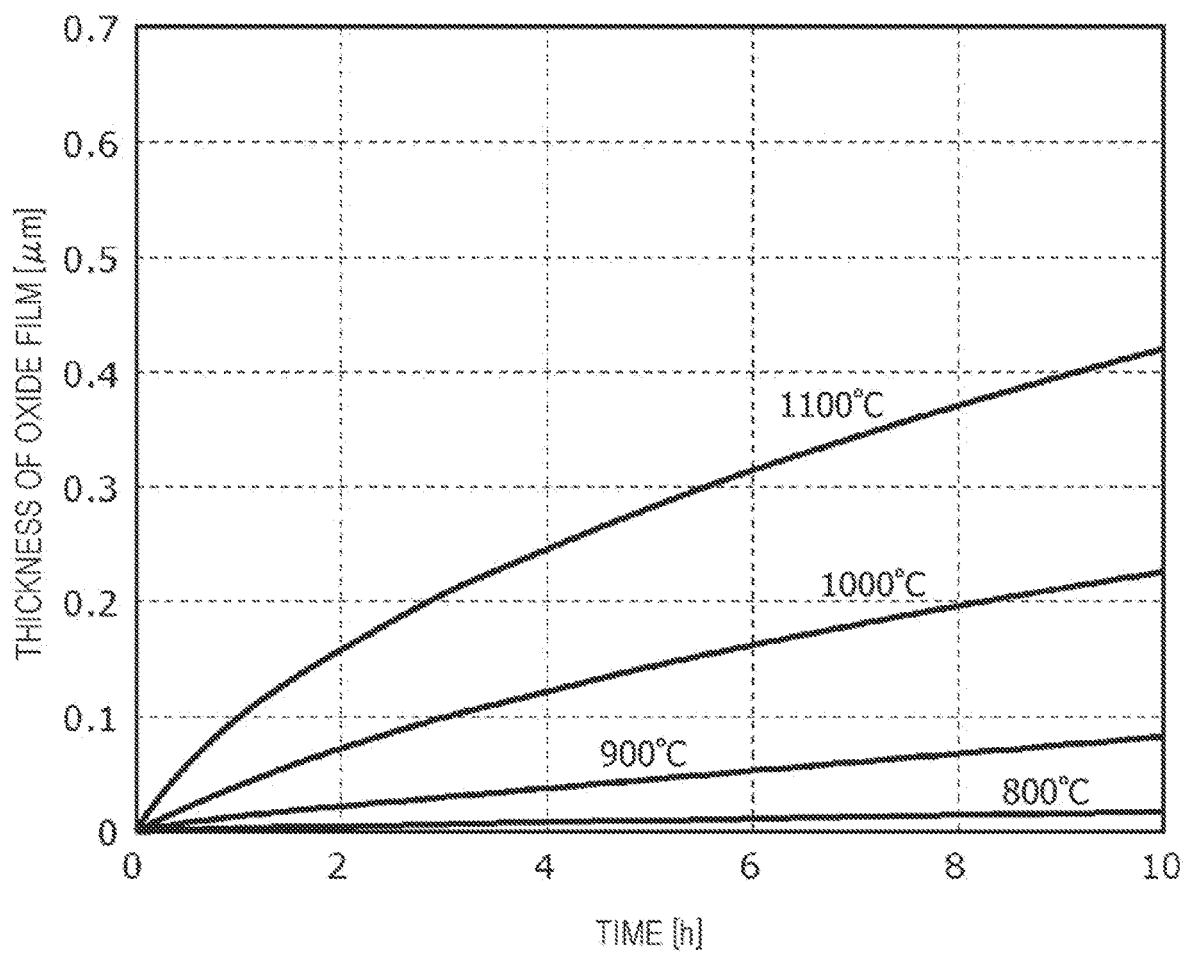
FIG. 8 is a graph illustrating temporal changes in thickness of an oxide film at various temperatures.

FIG. 8 is a graph illustrating temporal changes in thickness of the oxide film at various heating temperatures. Specifically, FIG. 8 illustrates a relation between the thickness of the silicon oxide film and oxidation time when subjecting silicon to dry oxidation. In FIG. 8, the vertical axis indicates the film thickness of the silicon oxide film and the horizontal axis indicates elapsed time of oxidation.

As illustrated in FIG. 8, it is apparent that an oxidation rate is reduced along with the passage of time after the start of oxidation. It is also apparent that the oxidation rate is reduced along with a drop in oxidation temperature. Silicon is oxidized by bonding of oxygen molecules that are present in the vicinity of a surface of silicon with silicon molecules that are present on the surface of silicon. In other words, the oxidation of silicon progresses from the surface of silicon and the film thickness of the silicon oxide film is gradually increased. When the silicon oxide film grows to a certain film thickness, the oxygen molecules need to penetrate the silicon oxide film so as to reach a portion of silicon that is not oxidized yet. For this reason, the oxidation rate is reduced along with the progress in oxidation.

When focusing on a graph plotted at 800° C. representing the lowest temperature in FIG. 8, the oxidation seems to progress gently for about six hours but the film thickness does not seem to increase very much after six hours. This phenomenon indicates that the oxygen molecules can hardly penetrate the silicon oxide film generated for six hours afterwards. In other words, the film thickness of the oxide film is saturated at a certain thickness and is not substantially increased any more unless a heating temperature is changed to a high level.

Although a detailed manufacturing method will be discussed later, this embodiment includes the steps of depositing a photoelectric conversion film, a transparent electrode film, and an insulating film sequentially after the formation of the protective film 70, and then carrying out removal of these films by etching. During a period from completion of this etching process to formation of the passivation film 54, the protective film 70 will be exposed to the atmosphere. Although this period depends on the manufacturing process, the exposure is assumed to continue for several days, for instance. Even in this case, it is considered very unlikely that the oxygen molecules completely penetrate the protective film 70 in the thickness of larger than or equal to 0.5 µm in light of the graph in FIG. 8. Since the exposure to the atmosphere is considered to generally take place at room temperature, it is likely that the oxide film is barely formed any more but is still capable of sufficiently fulfilling a function to suppress the passage of oxygen with the thickness of 0.5 µm.

The film thickness is saturated at a thickness smaller than 0.05 µm in the case of the temperature at 800° C. as illustrated in FIG. 8. In this regard, the film thickness of the protective film 70 may be set smaller than 0.5 µm, or more specifically, may be set to 0.05 µm, for instance. In consideration of a variation in film thickness in the course of formation of the protective film 70, the film thickness of the protective film 70 may be set larger than or equal to 0.1 µm.

Manufacturing Method

A method of manufacturing the imaging device 100 according to this embodiment will be described with reference to FIGS. 9 to 14. Each of FIGS. 9 to 14 is a schematic sectional view for explaining steps in the method of manufacturing the imaging device 100 according to this embodiment.

A. Step of Preparing Circuit Unit

Figure 9:
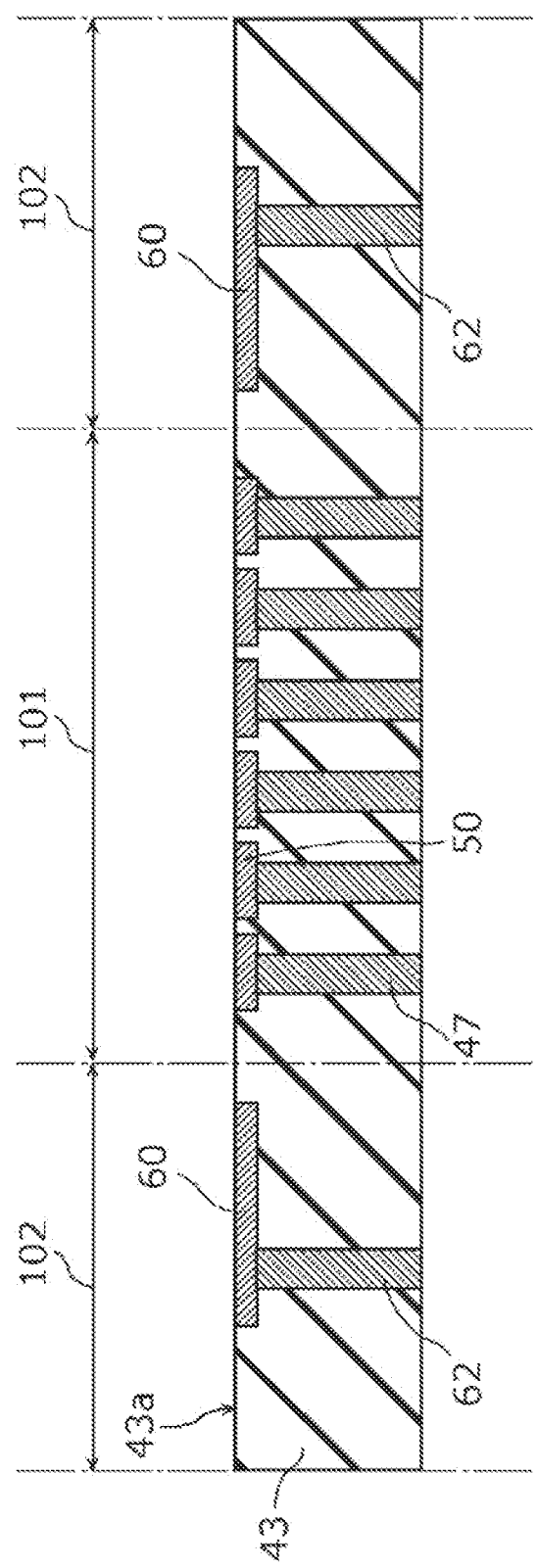
FIG. 9 is a schematic sectional view for explaining a step in a method of manufacturing an imaging device according to the embodiment.

A circuit unit is prepared as illustrated in FIG. 9 to begin with. To be more precise, the semiconductor substrate 31 (not shown in FIG. 9) provided with the interlayer insulating layer 43 is prepared. The pixel electrodes 50 and the plug top electrodes 60 are provided at the upper surface 43a of the interlayer insulating layer 43. The pixel electrodes 50 are provided in the pixel region 101. The plug top electrodes 60 are provided in the peripheral region 102. The plugs 62 are coupled to the plug top electrodes 60 in the peripheral region 102. To be more precise, the circuit unit is provided with the structure illustrated in FIG. 2 for each of the pixel electrodes 50, which can be formed by use of a publicly known method of manufacturing a semiconductor device.

B. Step of Forming Protective film 70

Figure 10:
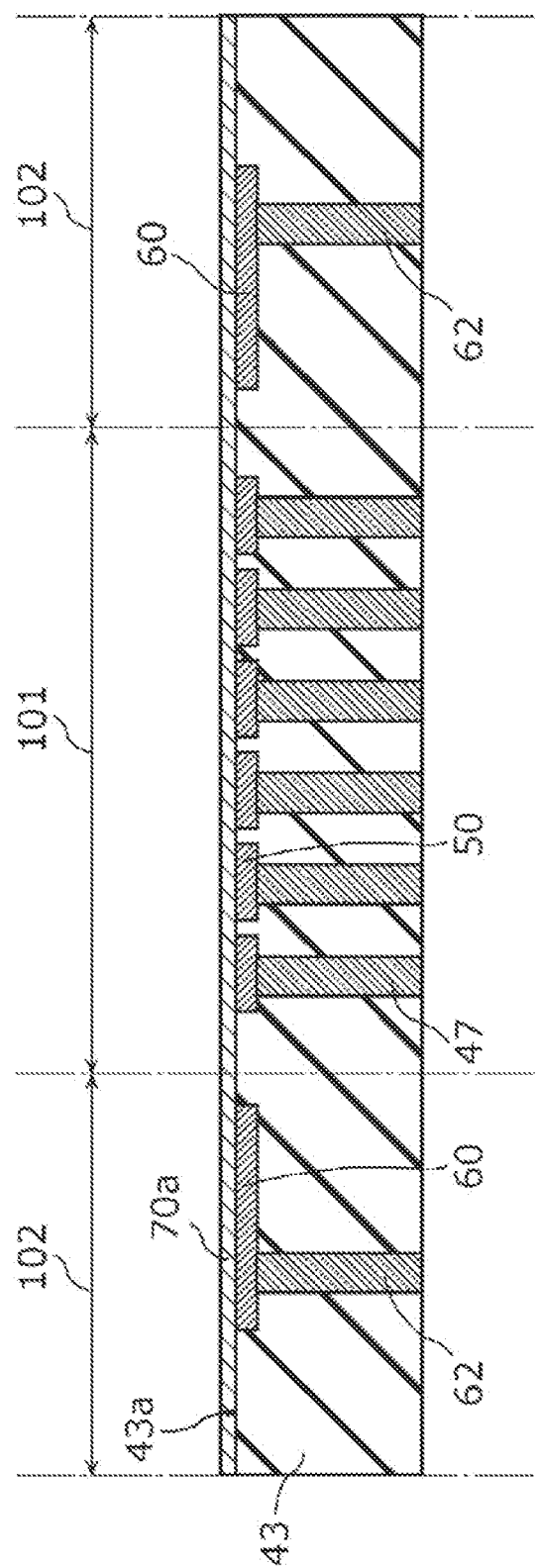
FIG. 10 is a schematic sectional view for explaining a step to be carried out subsequent to the step illustrated in FIG. 9.

A deposition film 70a constituting a base of the protective films 70 is formed as illustrated in FIG. 10. The deposition film 70a is formed on the entire upper surface 43a of the interlayer insulating layer 43 in such a way as to cover the pixel electrodes 50 and the plug top electrodes 60. A silicon oxide film is formed as the deposition film 70a by using a chemical vapor deposition (CVD) method, for example.

Figure 11:
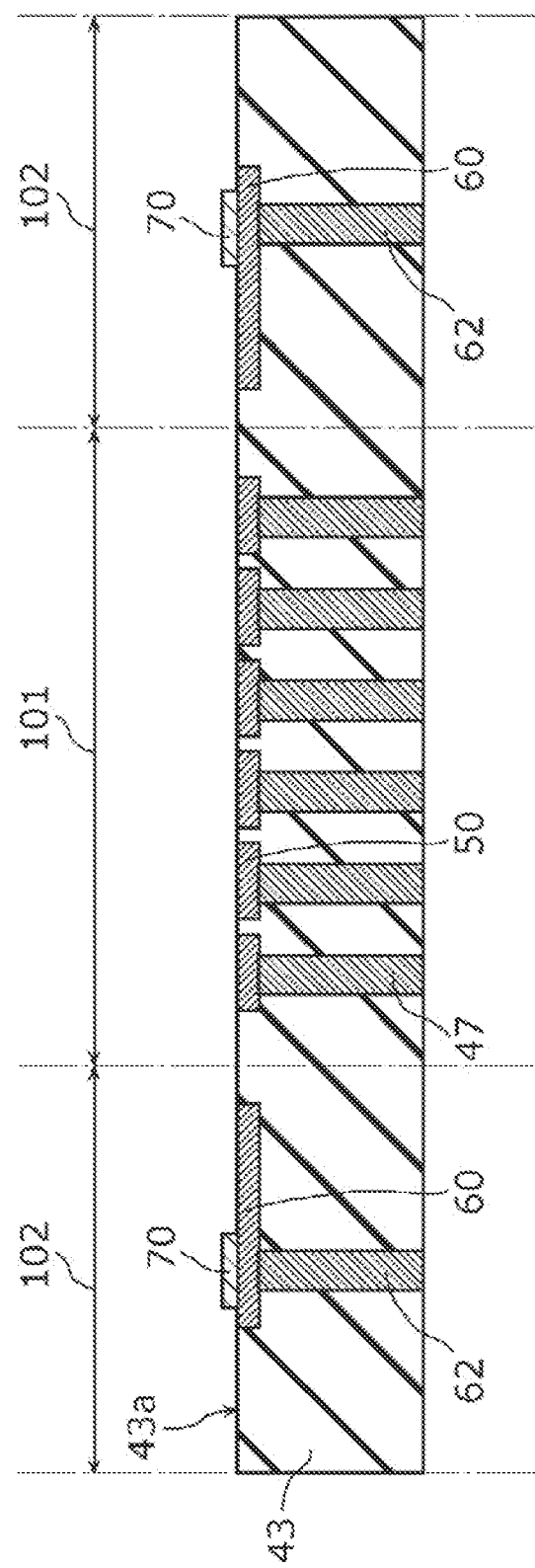
FIG. 11 is a schematic sectional view for explaining a step to be carried out subsequent to the step illustrated in FIG. 10.

A photosensitive resist is coated on the deposition film 70a, and a portion of the coated photosensitive resist is left only at locations to form the protective films 70 later by using photolithography and the like. Thereafter, a portion of the deposition film 70a not covered with the photosensitive resist is removed by etching, thereby forming the protective films 70 as illustrated in FIG. 11. In this instance, the pixel electrodes 50 may be damaged by etching depending on the material quality thereof. In that case, etching is carried out by means of wet etching.

Figure 12:
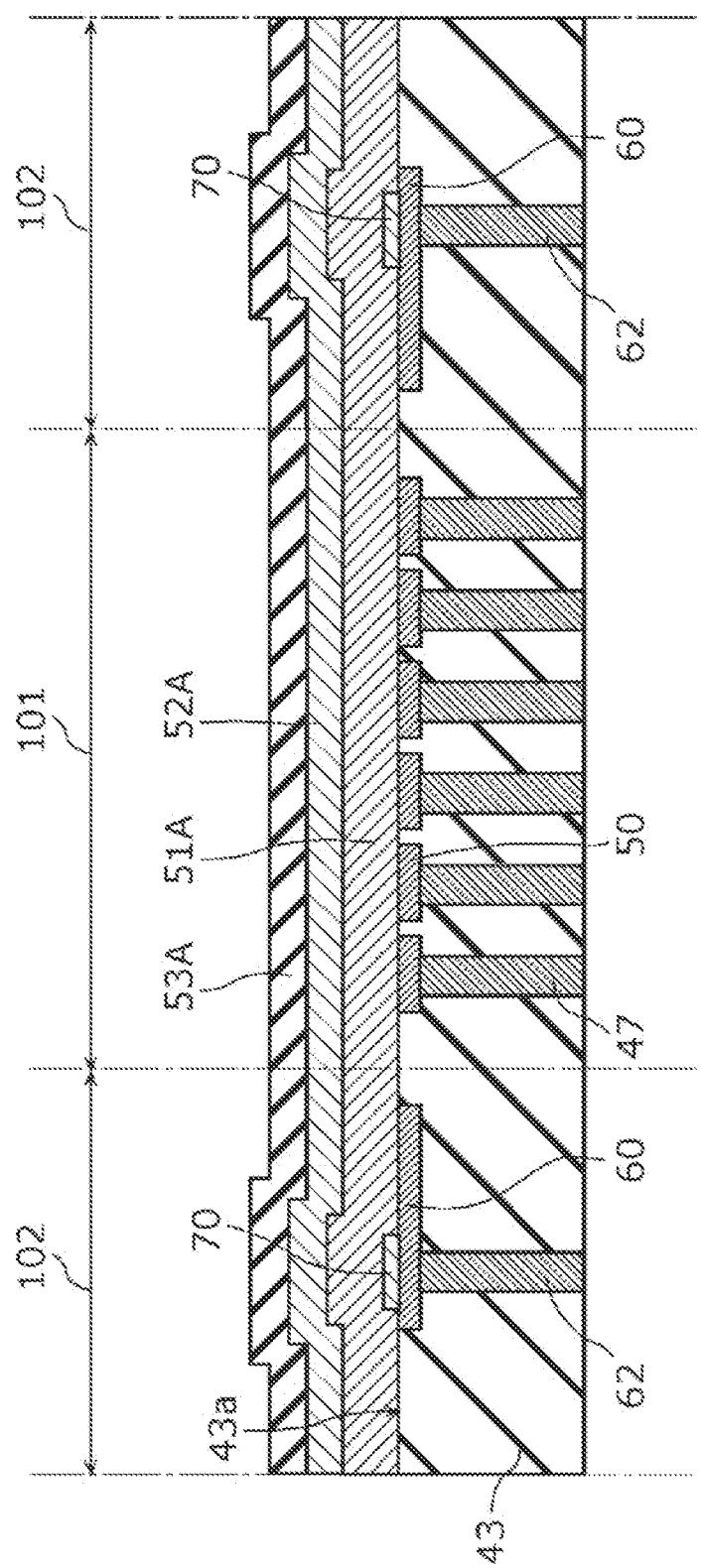
FIG. 12 is a schematic sectional view for explaining a step to be carried out subsequent to the step illustrated in FIG. 11.

C. Step of Depositing Photoelectric Conversion Film 51A, Conductive Film 52A, and Insulating Film 53A A photoelectric conversion film 51A is deposited on the upper surface 43a of the interlayer insulating layer 43 in such a way as to cover the pixel electrodes 50, the protective films 70, and the plug top electrodes 60 as illustrated in FIG. 12. A lower surface of the photoelectric conversion film 51A is in contact with each of the upper surface 43a of the interlayer insulating layer 43, the pixel electrodes 50, the protective films 70, and the plug top electrodes 60. Upper surfaces of these constitutes are flush with one another, whereby the lower surface of the photoelectric conversion film 51A becomes a flat surface.

The photoelectric conversion film 51A can be formed in accordance with any of a spin coating method, an ink jet method, a die coating method, a spray coating method, a vacuum deposition method, a screen printing method, and the like. The photoelectric conversion film 51A is patterned into a predetermined shape in a subsequent step, thereby being formed into the photoelectric conversion film 51 illustrated in FIG. 3.

A conductive film 52A for the transparent electrode 52 is formed on an upper surface of the photoelectric conversion film 51A. The conductive film 52A is formed in accordance with a sputtering method, for example. The conductive film 52A is patterned into a predetermined shape in a subsequent step, thereby being formed into the transparent electrode 52 illustrated in FIG. 3.

An insulating film 53A is formed on an upper surface of the conductive film 52A, The insulating film 53A can be formed in accordance with any of an atomic layer deposition (ALD) method, a chemical vapor deposition (CVD) method, and a sputtering method, for example. The insulating film 53A is patterned into a predetermined shape in a subsequent step, thereby being formed into the insulating layer 53 illustrated in FIG. 3.

Figure 13:
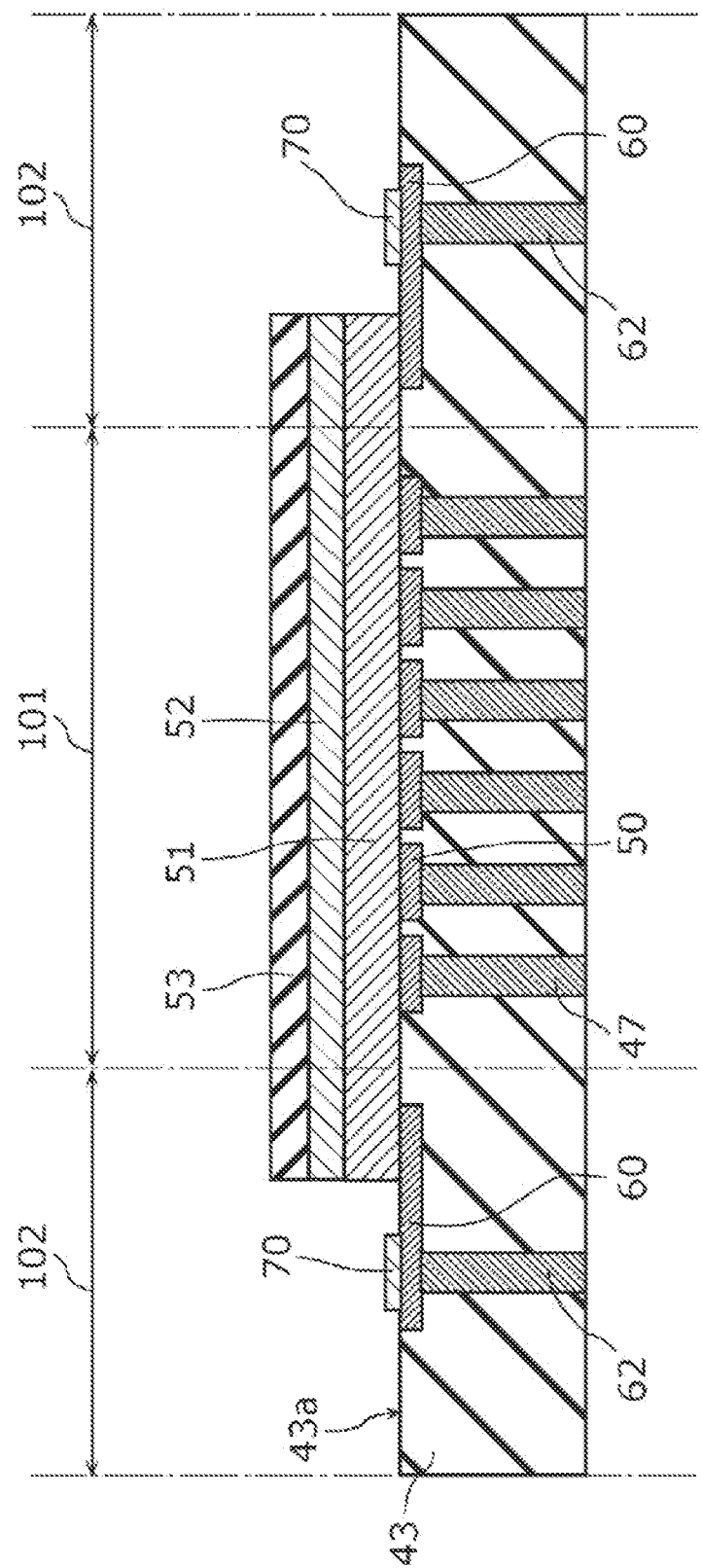
FIG. 13 is a schematic sectional view for explaining a step to be carried out subsequent to the step illustrated in FIG. 12.

D. Step of Patterning Photoelectric Conversion Film 51A, Conductive Film 52A, and Insulating Film 53A A photosensitive resist is coated on the insulating film 53A, and a portion of the coated photosensitive resist is left only at a location that corresponds later to the photoelectric conversion film 51 by using photolithography and the like. Thereafter, portions of the insulating film 53A, the conductive film 52A, and the photoelectric conversion film 51A not covered with the photosensitive resist are collectively removed by etching. Thus, the photoelectric conversion film 51, the transparent electrode 52, and the insulating layer 53 patterned into predetermined shapes are formed as illustrated in FIG. 13.

The respective films are etched by means of dry etching, for example. Etching of the insulating film 53A and the conductive film 52A is carried out by using a gas containing a halogen such as fluorine, chlorine, bromine, and iodine. In this case, it is possible to carry out etching accurately by using the gas containing at least one element out of fluorine and chlorine. Dry etching is carried out while using reactive ion etching (RIE), in which a gas is turned into plasma by means of plasma discharge and a chemical species of the gas turned into plasma reacts with the insulating film 53A and the conductive film 52A. When the insulating film 53A and the conductive film 52A are formed by using a material containing nitrogen or silicon, it is possible to etch the insulating film 53A and the conductive film 52A efficiently by using the gas and the etching method mentioned above.

Photoelectric conversion film 51A is etched by using a gas containing oxygen. To be more precise, a chamber is filled with the gas containing oxygen, and photoelectric conversion film 51A is partially oxidized by means of chemical etching associated with an oxidation reaction. Since the photoelectric conversion film 51A contains a large amount of carbon, it is possible to remove carbon in the form of carbon oxides as a consequence of the oxidation reaction with oxygen gas.

The photoelectric conversion film 51, the transparent electrode 52, and the insulating layer 53 in desired shapes are formed by carrying out a patterning step. A side surface of the photoelectric conversion film 51, a side surface of the transparent electrode 52, and a side surface of the insulating layer 53 are made flush with one another by collectively patterning these three layers.

In this instance, the plugs 62 are covered with the protective films 70. Accordingly, the plugs 62 are protected against the oxygen-containing gas to be used for etching the photoelectric conversion film 51A, for example. The plug top electrodes 60 also have a function to protect the plugs 62 as with the protective films 70. However, the protection of the plugs 62 is not sufficiently reliable due to a possible variation in film quality among the plug top electrodes 60. In this embodiment, the protective films 70 are provided above the plug top electrodes 60, and the protective films 70 completely cover the plugs 62 in plan view. Accordingly, it is possible to protect the plugs 62 more reliably. For example, the plugs 62 can be kept from damage and corrosion attributed to etching.

E. Step of Forming Wiring Line 61

Next, the wiring line 61 is formed for electrically coupling the transparent electrode 52 to the plug top electrodes 60. Specifically, the through holes 53a are formed in the insulating layer 53 to begin with. The through holes 53a are formed by photolithography and etching as with patterning of the insulating film 53A. Note that formation of the through holes 53a is not essential.

Then, a conductive thin film is formed in such a way as to come into contact with and to cover each of the upper surface and the side surfaces of the insulating layer 53, the side surfaces of the transparent electrode 52, and the side surfaces of the photoelectric conversion film. The conductive thin film can be formed in accordance with a sputtering method, a vapor deposition method, and the like.

Thereafter, a resist pattern is formed so as to expose a region of the conductive thin film at least provided with the pixel electrodes 50, namely, the pixel region 101, and a portion of the conductive thin film is removed by etching while using the formed resist pattern as a mask. In this embodiment, the resist pattern further exposes the protective films 70.

Figure 14:
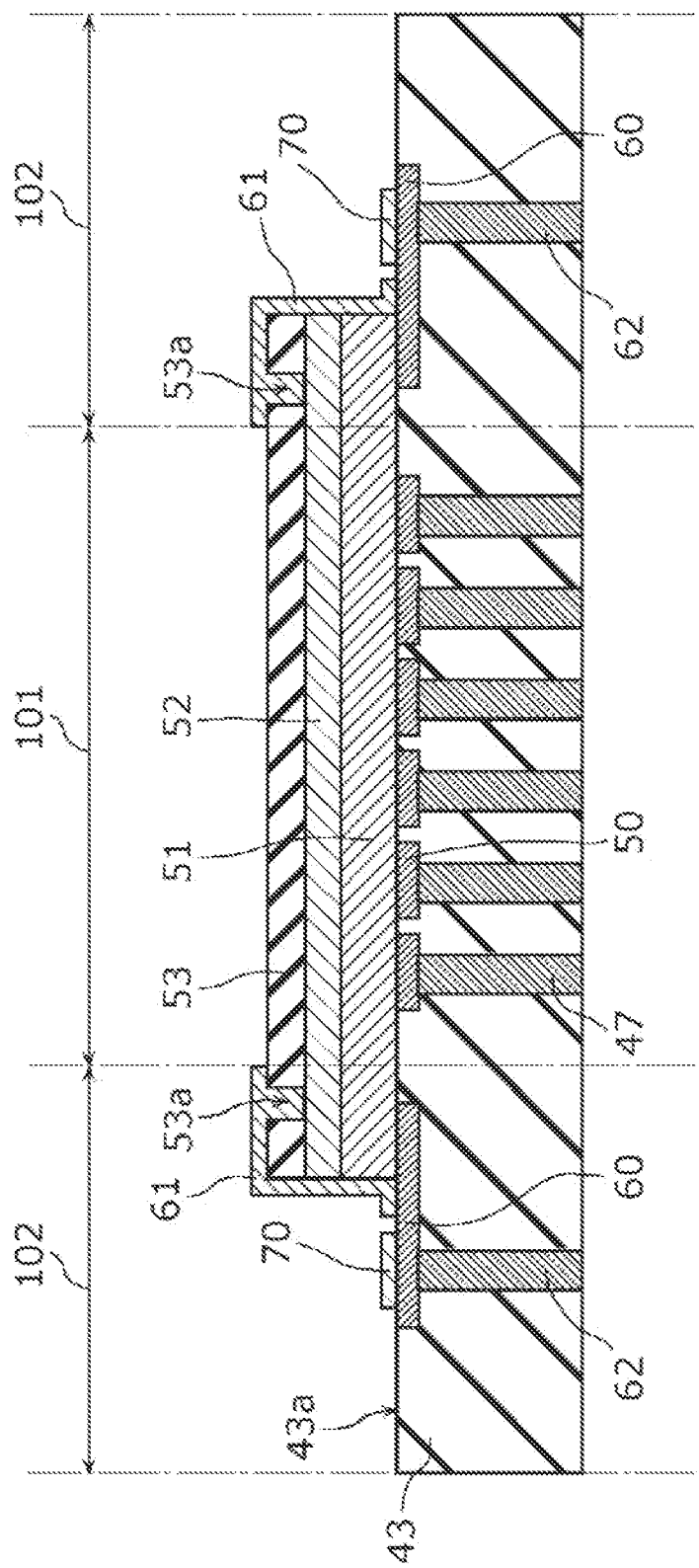
FIG. 14 is a schematic sectional view for explaining a step to be carried out subsequent to the step illustrated in FIG. 13.

Thus, the wiring line 61 is formed as illustrated in FIG. 14, which is joined to the plug top electrodes 60 at the upper surface 43a of the interlayer insulating layer 43 and joined to the side surfaces of the transparent electrode 52 as well as the portions on the upper surface of the transparent electrode 52 exposed inside of the through holes 53a. In this embodiment, the wiring line 61 is formed in such a way as not to cover the protective films 70.

Since the wiring line 61 is formed on the outer periphery of the elements, the wiring line 61 may lead to an increase in element size when the size of the wiring line 61 is large. Accordingly, the wiring line 61 is formed into a minimum required size by means of forming the wiring line 61 from the conductive thin film.

F. Step of Forming Passivation Film 54

Next, the passivation film 54 is formed substantially on the entire surface so as to cover the interlayer insulating layer 43, the plug top electrodes 60, the wiring line 61, the protective films 70, and the insulating layer 53. In this way, it is possible to manufacture the imaging device 100 that includes the protective films 70 provided above the plugs 62 in order to enhance corrosion resistance as illustrated in FIG. 3.

MODIFIED EXAMPLE 1

A modified example 1 of the embodiment will be described below with reference to FIGS. 15 and 16.

Figure 15:
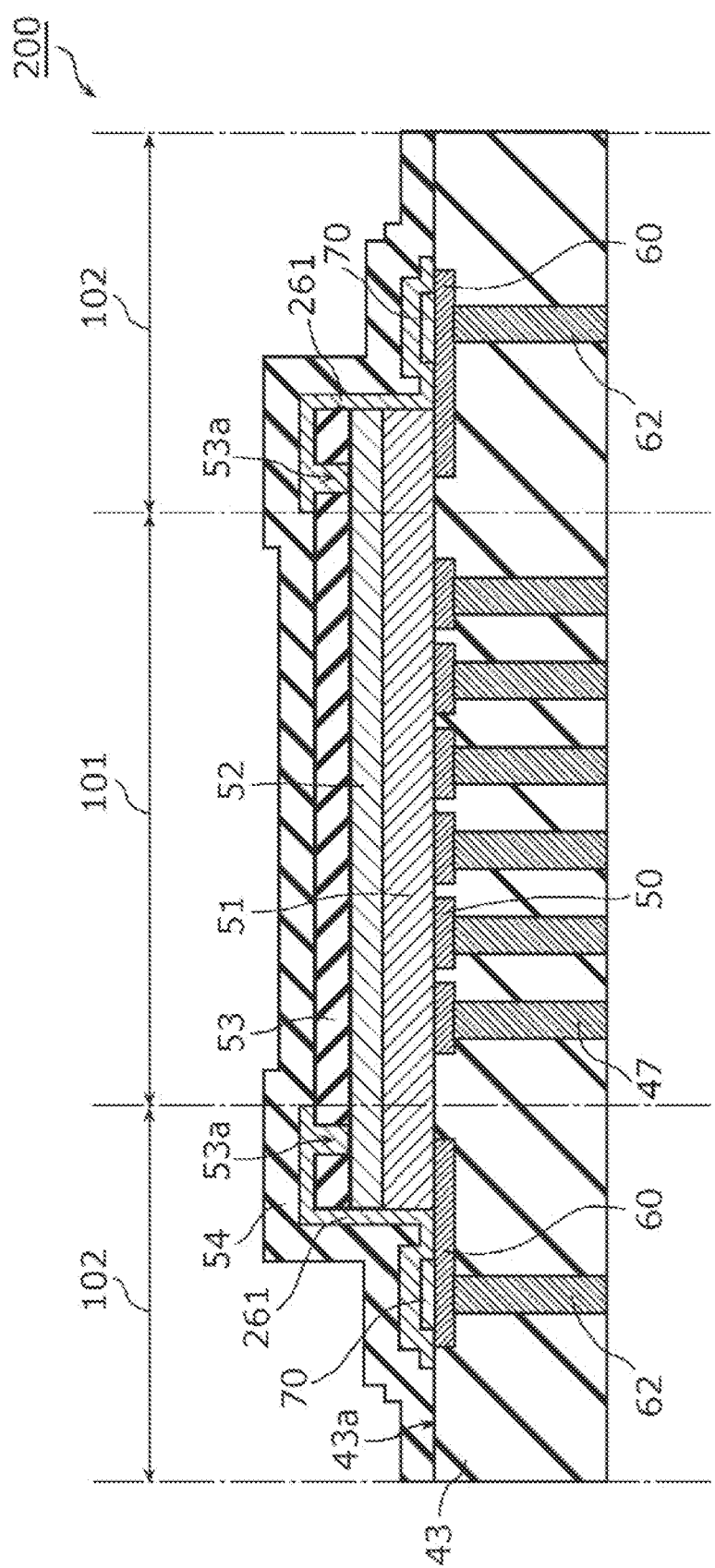
FIG. 15 is a schematic sectional view of an imaging device according to a modified example 1 of the embodiment.

FIG. 15 is a schematic sectional view of an imaging device 200 according to this modified example. FIG. 16 is a plan view of the imaging device 200 of this modified example.

Figure 16:
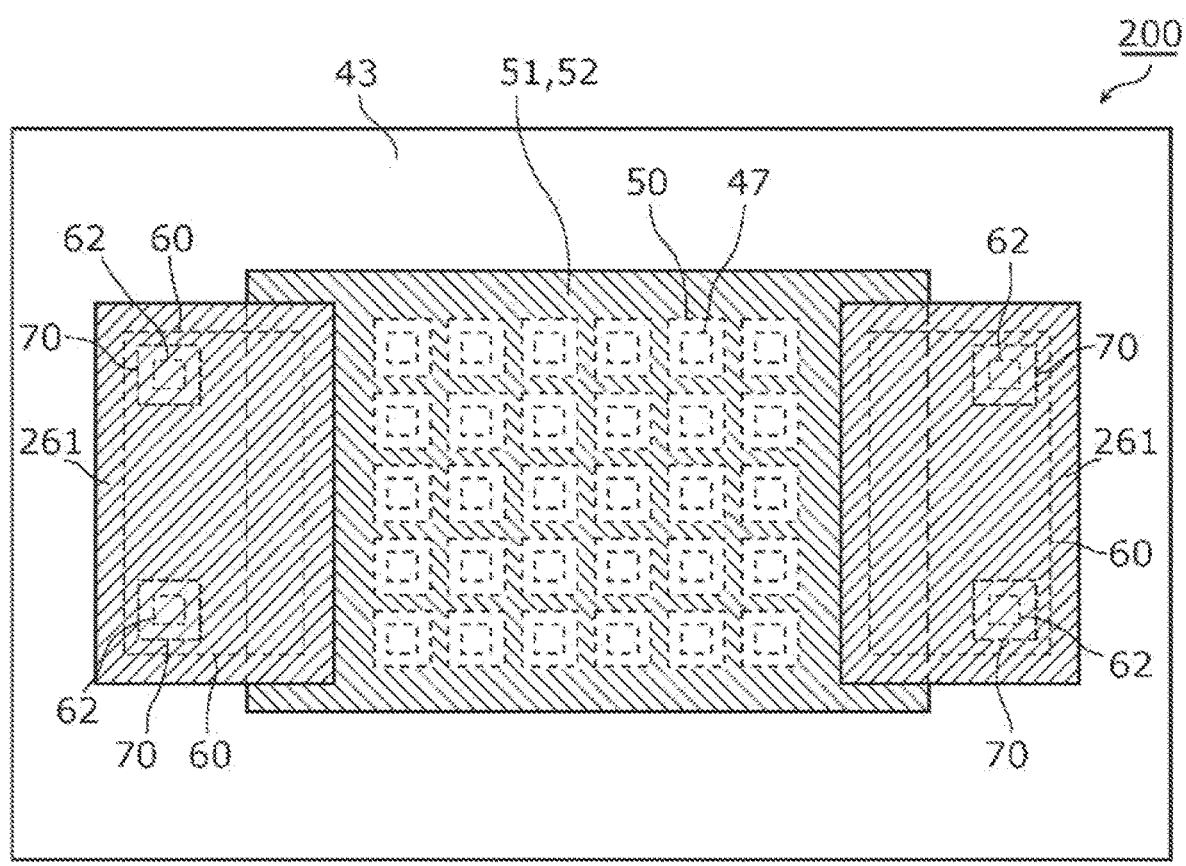
FIG. 16 is a schematic plan view of the imaging device according to the modified example 1 of the embodiment.

As illustrated in FIGS. 15 and 16, as compared to the imaging device 100 according to the embodiment, the imaging device 200 according to this modified example is different in that a wiring line 261 is provided instead of the wiring line 61. In the following description, different features from those of the embodiment will be mainly discussed and explanations of the features in common will be either omitted or simplified.

The wiring line 261 covers the protective films 70. The wiring line 261 is in contact with the upper surfaces and the side surfaces of the protective films 70. As illustrated in FIG. 15, the wiring line 261 is sandwiched between the protective film 70 and the passivation film 54.

As illustrated in FIG. 16, for example, the wiring line 261 overlaps the entire protective films 70 in plan view. The wiring line 261 is formed slightly larger than each plug top electrode 60. The wiring line 261 does not have to cover the entire plug top electrode 60 and may partially expose the plug top electrode 60. Likewise, the wiring line 261 does not have to cover the entire protective film 70 and may partially expose the protective film 70.

The wiring line 261 is formed by changing the shape of the resist pattern in the manufacturing process described with reference to FIG. 14. Specifically, the wiring line 261 can be formed on the protective films 70 by forming the resist pattern in such a way as to cover the protective films 70.

This modified example can also suppress modification of the plugs 62 by using the protective films 70, thereby suppressing deterioration in characteristics of the imaging device 200. It is possible to increase the contact area between the wiring line 261 and each plug top electrode 60, thereby reducing the contact resistance.

MODIFIED EXAMPLE 2

Figure 17:
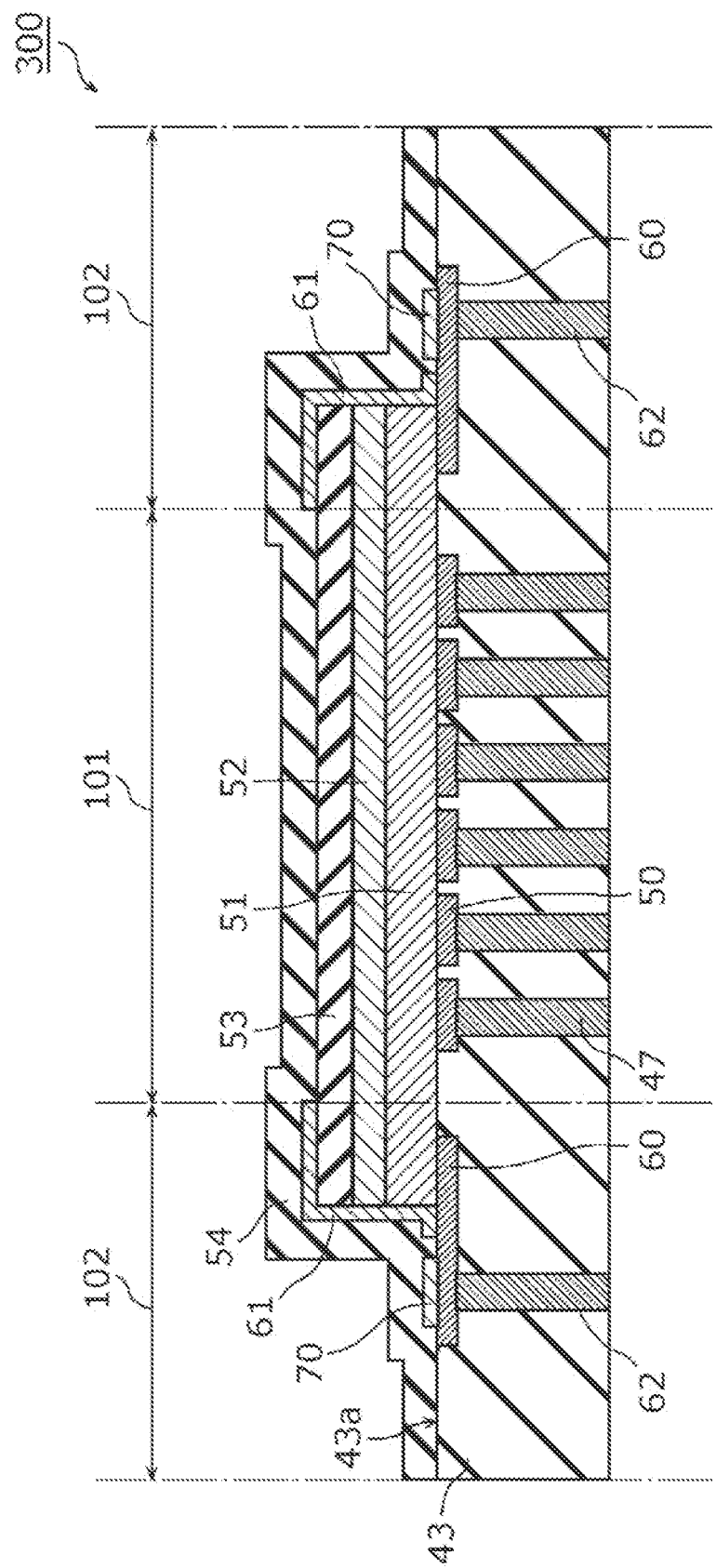
FIG. 17 is a schematic sectional view of an imaging device according to a modified example 2 of the embodiment.

A modified example 2 of the embodiment will be described with reference to FIG. 17. FIG. 17 is a schematic sectional view of an imaging device 300 according to this modified example.

As illustrated in FIG. 17, as compared to the imaging device 100 according to the embodiment, the imaging device 300 according to this modified example is different in that the insulating layer 53 is not provided with the through holes 53a. In other words, in the imaging device 300, the wiring line 61 comes into contact only with an end surface of the transparent electrode 52.

The imaging device 300 according to this modified example can curtail the step of forming the through holes 53a. Note that the imaging device 200 according to the modified example 1 does not have to be provided with the through holes 53a likewise.

Other Embodiments

The imaging devices according to one or more aspects have been described above based on the embodiments. However, the present disclosure is not limited only to these embodiments. The present disclosure also encompasses applications of various modifications conceived by those skilled in the art to the embodiments, aspects constructed by a combination of the constituents in the different embodiments as long as such modifications and aspects do not depart from the scope of the present disclosure.

For example, in the above-described embodiment, the imaging device 100 may detect a change in capacity of the photoelectric conversion film 51 instead of detecting the charges obtained by the photoelectric conversion. In other words, the photoelectric conversion film 51 may generate pairs of hole and electron in response to the intensity of the incident light and its capacitance may vary depending on the intensity of the incident light. Each pixel 110 can detect the light incident on the photoelectric conversion film 51 by detecting a change in generated charges or capacitance.

For example, the pixel electrodes 50 may be provided on a different layer from the layer where the plug top electrodes 60 are provided. In other words, the height of each of the pixel electrodes 50 from the semiconductor substrate 31 may be different from the height of each plug top electrode 60 from the semiconductor substrate 31. For example, each plug top electrode 60 may be provided at a position closer to the semiconductor substrate 31 than to the upper surface 43a of the interlayer insulating layer 43. To be more precise, the plug top electrode 60 may be provided between the insulating layer 43B and the insulating layer 43C.

The respective embodiments described above may be subjected to various modifications, substitution, addition, omission, and the like within the scope of the appended claims or a range equivalent thereto.

The present disclosure can be adapted to an imaging device that suppresses deterioration in characteristics. For example, the present disclosure is applicable to a camera, a ranging device, and the like.

What is claimed is:

1. An imaging device comprising:
a photoelectric conversion film;
a first electrode located above the photoelectric conversion film;
a second electrode;
a plug coupled to the second electrode;
a protective film located above the second electrode; and
a wiring line that electrically couples the first electrode to the second electrode, wherein
the protective film overlaps an entirety of the plug and does not overlap the photoelectric conversion film in plan view,
the second electrode includes a non-overlapping portion that does not overlap the protective film in plan view, and
the wiring line is coupled to the non-overlapping portion of the second electrode.

2. The imaging device according to claim 1, wherein
the protective film includes a marginal portion that extends outward from the plug in plan view, and
a tip end in an extending direction of the marginal portion is located away by 1 µm or more from the plug in plan view.

3. The imaging device according to claim 2, wherein the marginal portion surrounds an entire circumference of the plug in plan view.

4. The imaging device according to claim 1, wherein an area of the protective film is smaller than an area of the second electrode in plan view.

5. The imaging device according to claim 1, wherein a thickness of the protective film is larger than or equal to 0.5 µm.

6. The imaging device according to claim 1, wherein the plug contains copper.

7. The imaging device according to claim 1, wherein the protective film has an insulating property.

8. The imaging device according to claim 1, wherein the wiring line covers the protective film.

9. The imaging device according to claim 1, wherein the first electrode has translucency.

10. The imaging device according to claim 1, wherein a width of the protective film is smaller than a width of the second electrode.

11. The imaging device according to claim 1, wherein the protective film does not overlap the first electrode in plan view.

12. The imaging device according to claim 1, wherein the second electrode is in contact with a side surface of the photoelectric conversion film.

13. The imaging device according to claim 1, wherein a side surface of the first electrode is flush with a side surface of the photoelectric conversion film.

* * * * *